(12) United States Patent
Hsieh

(10) Patent No.: US 12,432,966 B2
(45) Date of Patent: Sep. 30, 2025

(54) SHIELDED GATE TRENCH MOSFETS WITH IMPROVED TERMINATION STRUCTURES

(71) Applicant: Nami MOS CO., LTD., New Taipei (TW)

(72) Inventor: Fu-Yuan Hsieh, New Taipei (TW)

(73) Assignee: NAMI MOS CO., LTD., New Taipei (TW)

(*) Notice: Subject to any disclaimer, the term of this patent is extended or adjusted under 35 U.S.C. 154(b) by 519 days.

(21) Appl. No.: 17/964,172

(22) Filed: Oct. 12, 2022

(65) Prior Publication Data
US 2024/0128369 A1   Apr. 18, 2024

(51) Int. Cl.
*H10D 30/66* (2025.01)
*H10D 62/10* (2025.01)
*H10D 64/00* (2025.01)

(52) U.S. Cl.
CPC ......... *H10D 30/668* (2025.01); *H10D 30/665* (2025.01); *H10D 62/111* (2025.01); *H10D 64/117* (2025.01)

(58) Field of Classification Search
CPC .. H10D 30/668; H10D 30/665; H10D 62/111; H10D 64/117

USPC ......................................... 257/330
See application file for complete search history.

(56) References Cited

U.S. PATENT DOCUMENTS

2019/0386095 A1* 12/2019 Takeuchi ............ H10D 62/393

* cited by examiner

*Primary Examiner* — Norman D Richards
*Assistant Examiner* — Sammantha K Salaz
(74) *Attorney, Agent, or Firm* — BACON & THOMAS, PLLC

(57) ABSTRACT

Shielded gate trench MOSFETs with gate trenches separated from termination trenches are disclosed, wherein a first type body regions are formed in an active area and an first type electric field reducing regions formed adjacent to an intersection regions between a first termination trench and trench ends of gate trenches; The first type electric field reducing regions formed between the first type body regions and the first termination trench wherein the first type body regions are absent to enhance breakdown voltage. At least one second type body region of the second conductivity type with a floating voltage is formed within the first type field reducing regions, and is spaced apart from the first type body regions and the first termination trench for further increasing breakdown voltage.

19 Claims, 25 Drawing Sheets

SHIELDED GATE TRENCH MOSFETS WITH IMPROVED TERMINATION STRUCTURES

FIELD OF THE INVENTION

This invention relates generally to a shielded gate trench (SGT) MOSFET (Metal Oxide Semiconductor Field Effect Transistor) having electric field reducing regions for improving avalanche breakdown voltage and reducing drain-source leakage current.

BACKGROUND OF THE INVENTION

Please refer to FIG. 1A for a top view of a conventional SGT semiconductor power device wherein a first type P body regions are formed in an area surrounded by a first termination trench. The first termination trench along a X axis has a plurality of intersection regions with trench ends of a plurality of gate trenches along a Y axis. Early avalanche breakdown occurring at the plurality of intersection regions is observed for medium voltage shielded gate trench MOSFETs with breakdown voltages ranging from 60-300 V A plurality of hot spot points specified as "H" of FIG. 1A located at the plurality of intersection regions have a very high drain-source leakage current Ids due to the early avalanche breakdown. Moreover, device ruggedness is also degraded because of the high leakage current Ids. FIGS. 1B and 1C show cross sections of FIG. 1A along A1-A1' in the X axis and B1-B1' in the Y axis, respectively. The first type P body regions 110' in FIG. 1B are formed between two adjacent gate trenches in the active area, and between a gate trench in the active area and a first termination trench in the termination area, thus, a uniform avalanche breakdown is maintained due to oxide charge balance. However, in FIG. 1C showing a cross section along the Y axis having a hot spot in FIG. 1A near the first termination trench, the first type P body regions 110" shorted together with a source metal extend from the active area toward the termination area and connect to trench sidewalls of the first termination trench, of which cross section is quite different from FIG. 1B, resulting in the early avalanche breakdown at P/N junction near the first termination trench.

Therefore, there is still a need to provide new device configurations such that above discussed problem and limitation can be resolved.

SUMMARY OF THE INVENTION

The present invention provides new SGT MOSFETs with an improved device area adjacent to the intersection regions between the first termination trench and the trench ends of the plurality of gate trenches. A first type electric field reducing region is formed adjacent to the intersection regions of the first type termination trench along the X axis and trench ends of the plurality of gate trenches along the Y axis, wherein the first type P body regions are absent in the first type electric field reducing region to avoid the early avalanche breakdown at P/N junction near the first termination trench.

According to one aspect, the invention features a SGT device comprising: an active area, a termination area, a gate metal pad area, a central gate metal runner and at least one shielded gate trench contact row area; the active area comprises a plurality of gate trenches formed in an epitaxial layer of a first conductivity type onto a substrate of the first conductivity type along the X axis including a first type active trench having a first trench length, and a second type active trench near the gate pad area having a second trench length, wherein the first type active trench length is longer than the second type active trench length; the termination area comprises at least one first termination trench surrounding outer periphery of the plurality of gate trenches along the X axis and Y axis, and at least one first termination trench is separated from the plurality of gate trenches and does not surround the gate pad area; and the SGT device further comprising: plurality of gate trenches formed in the active area, surrounded by a first type source regions of a first conductivity type are encompassed in a first type body regions of a second conductivity type near a top surface of an epitaxial layer of the first conductivity type, each of the gate trenches is filled with a gate electrode and a shielded gate electrode; the shielded gate electrode is insulated from the epitaxial layer by a first insulating film, the gate electrode is insulated from the epitaxial layer by a gate oxide, the shielded gate electrode and the gate electrode are insulated from each other by an (Inter-Poly Oxide) IPO film, the gate oxide surrounds the gate electrode and has less thickness than the first insulating film; the gate electrode inside each of the gate trenches is connected to the gate metal pad through the central gate metal runner having a plurality of gate trench contacts underneath, the shielded gate electrode inside each of the gate trenches is connected to a source metal through at least one shielded gate trench contact on each of the plurality of gate trenches.

According to another aspect, in some preferred embodiments, at least one second type P body region with a floating voltage is formed between the first type P body regions and the at least one termination trench in the Y axis for breakdown voltage enhancement. The at least one second type body region is spaced apart from the first type body regions and the at least one first type termination region as well.

According to another aspect, in some preferred embodiments, the epitaxial layer is a single epitaxial layer with a uniform doping concentration. In some other preferred embodiments, the epitaxial layer has multiple stepped epitaxial (MSE) layers with different doping concentrations decreasing stepwise in a direction from bottoms of the plurality of gate trenches toward the first type body regions along sidewalls of the gate trenches.

According to another aspect, in some preferred embodiments, the SGT device further comprises a second type electric field reducing region surrounding each bottom of the plurality of gate trenches with a doping concentration lower than a bottom first epitaxial layer of the MSE layers for breakdown voltage enhancement. The purpose of installation of the second electric field reducing region into the SGT device is to solve breakdown voltage degradation as the field oxide thickness at each bottom of the plurality of gate trenches is less than that at sidewalls.

According to another aspect, in some preferred embodiments, the SGT device further comprises a third type electric field reducing region of the second conductivity type surrounding a bottom of the at least one first type termination trench in the termination area.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The accompanying drawings, which are included to provide a further understanding of the invention and are incorporated in and constitute a part of this specification, illustrate exemplary embodiments of the invention and together with the description to explain the principles of the invention. In the drawings.

DETAILED DESCRIPTION

In the following Detailed Description, reference is made to the accompanying drawings, which forms a part thereof, and in which is shown by way of illustration specific embodiments in which the invention may be practiced. In this regard, directional terminology, such as "top", "bottom", "front", "back", etc., is used with reference to the orientation of the Figure(s) being described. Because components of embodiments can be positioned in a number of different orientations, the directional terminology is used for purpose of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims. It is to be understood that the features of the various exemplary embodiments described herein may be combined with each other, unless specifically noted otherwise.

Figure 2:
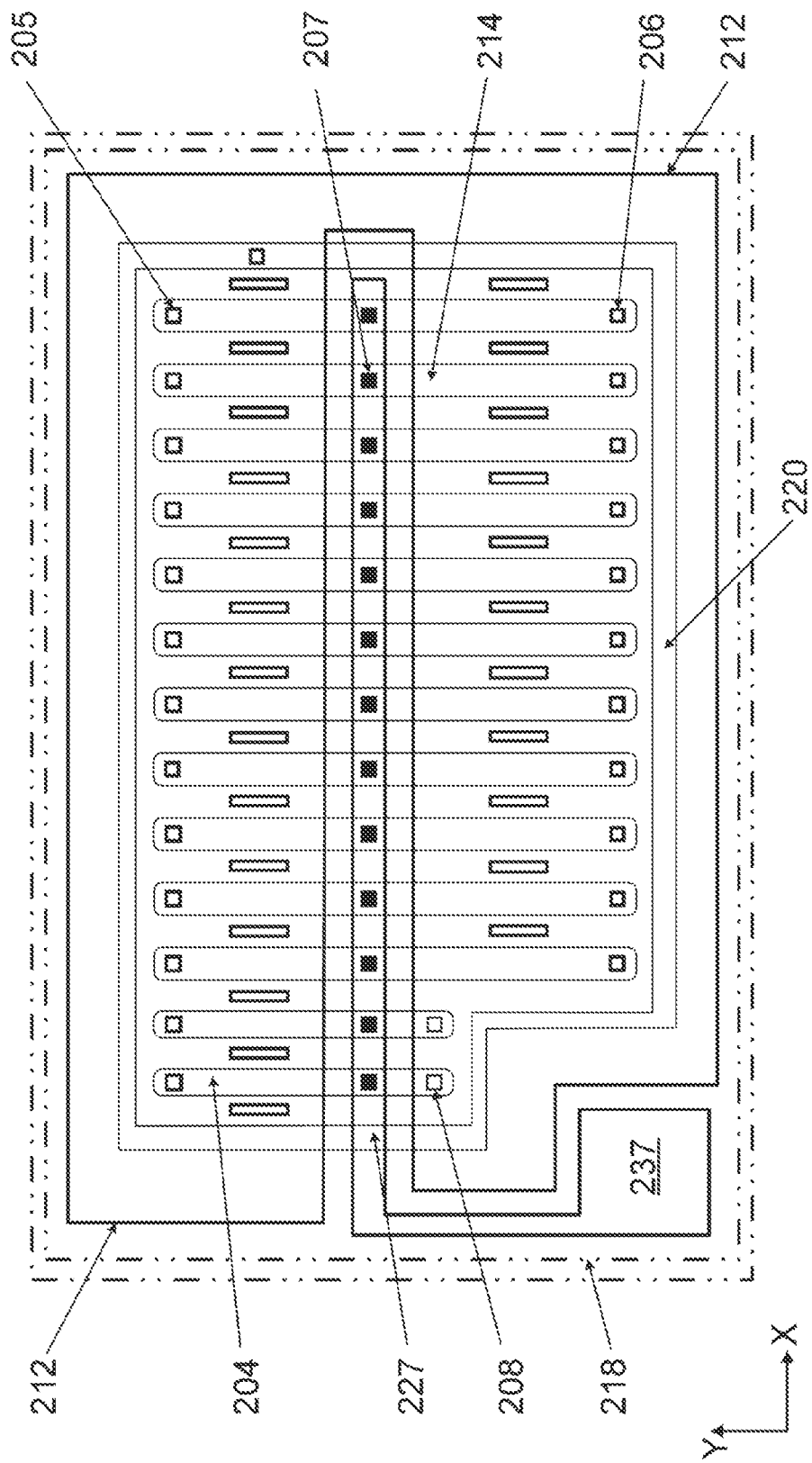
FIG. 2 is a top view of a preferred embodiment for an SGT MOSFET with a single termination trench according to the present invention.

Please refer to FIG. 2 for a top view of a preferred embodiment for an SGT semiconductor power device according to the present invention, wherein the SGT semiconductor power device comprises an active area, a termination area, a gate metal pad area 237, a central gate metal runner 227 located in the vicinity of the middle of the source metal 212 having a plurality of gate trench contacts 207 underneath. In the active area, a plurality of the first type active trenches 214 and the second type active trenches 204 are formed in an N type epitaxial layer onto a N+ substrate along a first axis direction (the Y reference direction), wherein the length of the first type active trench 214 is longer than that of the second type active trench 204, and the second type active trenches 204 locate above the gate metal pad area 237. On each of the first type active trenches 214, a top shielded gate trench contact 205, a bottom shielded gate trench contact 206 and one gate trench contact 207 in the vicinity of the middle of the source metal 212 are formed while on each of the second type active trenches 204, a top shielded gate trench contact 205 and a bottom shielded gate trench contact 208 and one gate trench contact 207 are formed. In the termination area, a single termination trench 220 is formed surrounding outer periphery of the first type active gate trenches 214 and second type active gate trenches 204 in a first direction along the first axis direction (the Y reference direction) and in a second direction along a second axis direction (the X reference direction) wherein the first axis is vertical to the second axis, and the single termination trench is separated from the gate trenches 214 and 204 and does not surround the gate metal pad area 237. A channel stop metal 218 in the termination area is formed.

Figure 3A:
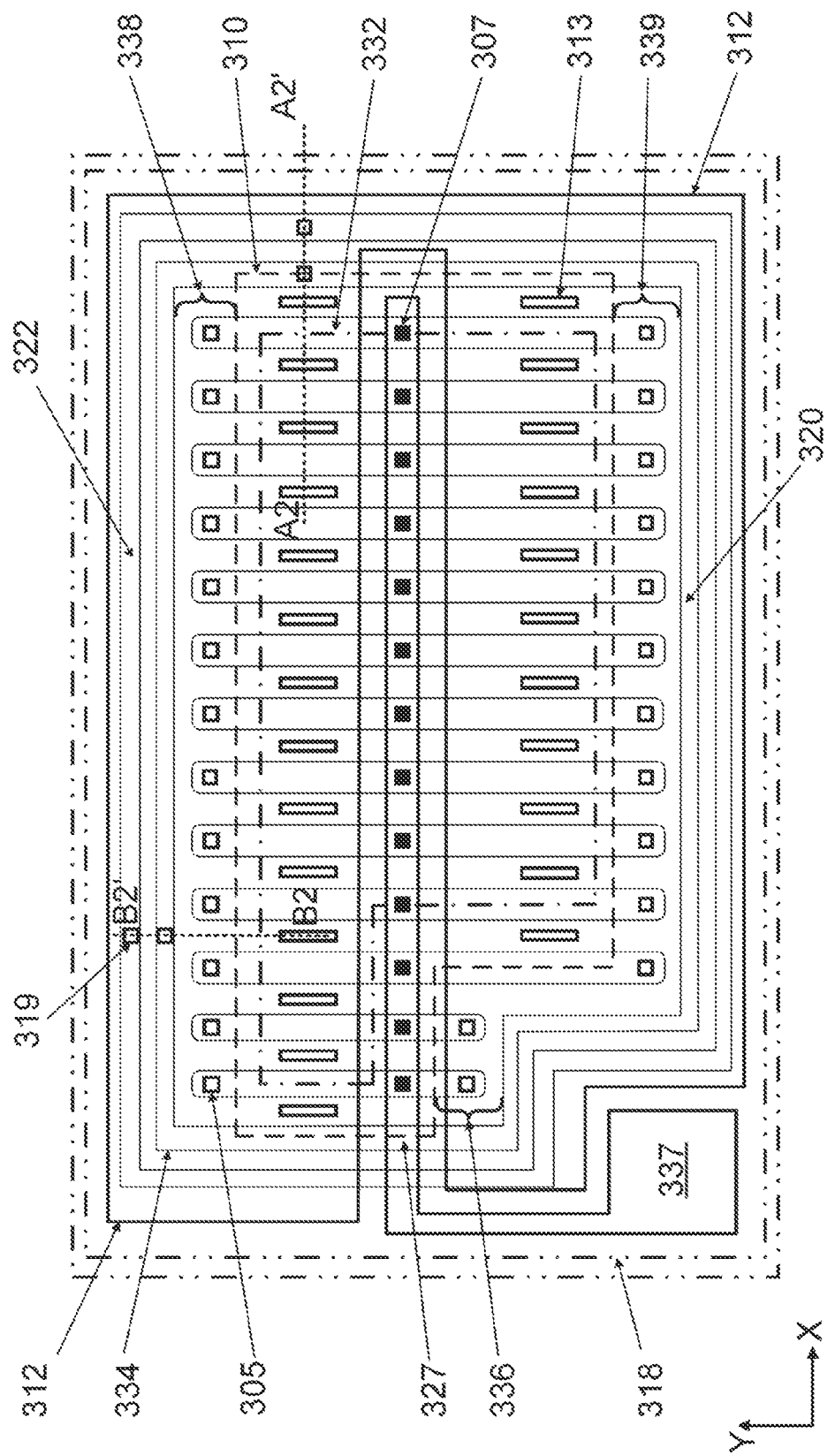
FIG. 3A is a top view of a preferred embodiment of SGT MOSFET.

Please refer to FIG. 3A for a top view of a conventional SGT MOSFET of prior art, wherein the SGT semiconductor power device comprises an active area 332 (denoted by a dashed line box 332), a termination area 334 surrounding the active area 332 (outside of the dashed line box 332), a gate metal pad area 337, a gate metal runner 327 and a channel stop metal 318. The semiconductor power device has a similar structure to FIG. 2, except that, in FIG. 3A, in the termination area, multiple termination trenches including the first termination trench 320 and the second termination trench 322 with termination contact 319 are formed surrounding outer periphery of the first type active gate trenches and the second type active gate trenches in a first direction along the first axis direction (the Y reference direction) and in a second direction along a second axis direction (the X reference direction) wherein the first axis is vertical to the second axis. Moreover, the first type P body regions 310 (inside a dashed line box 310) are shorted together with a source metal 312 and spaced apart from the first termination trench 320. A first type electric field reducing regions 336, 338 and 339 wherein the first type body regions are absent are formed between the first type P body regions 310 and the first termination trench 320 along the second axis direction (the X reference direction). Therefore, the early breakdown at P/N junction near the first termination trench is avoided and the hot spots appearing adjacent to the intersection area between the first termination trench and trench ends of the gate trenches are immune.

Figure 3B:
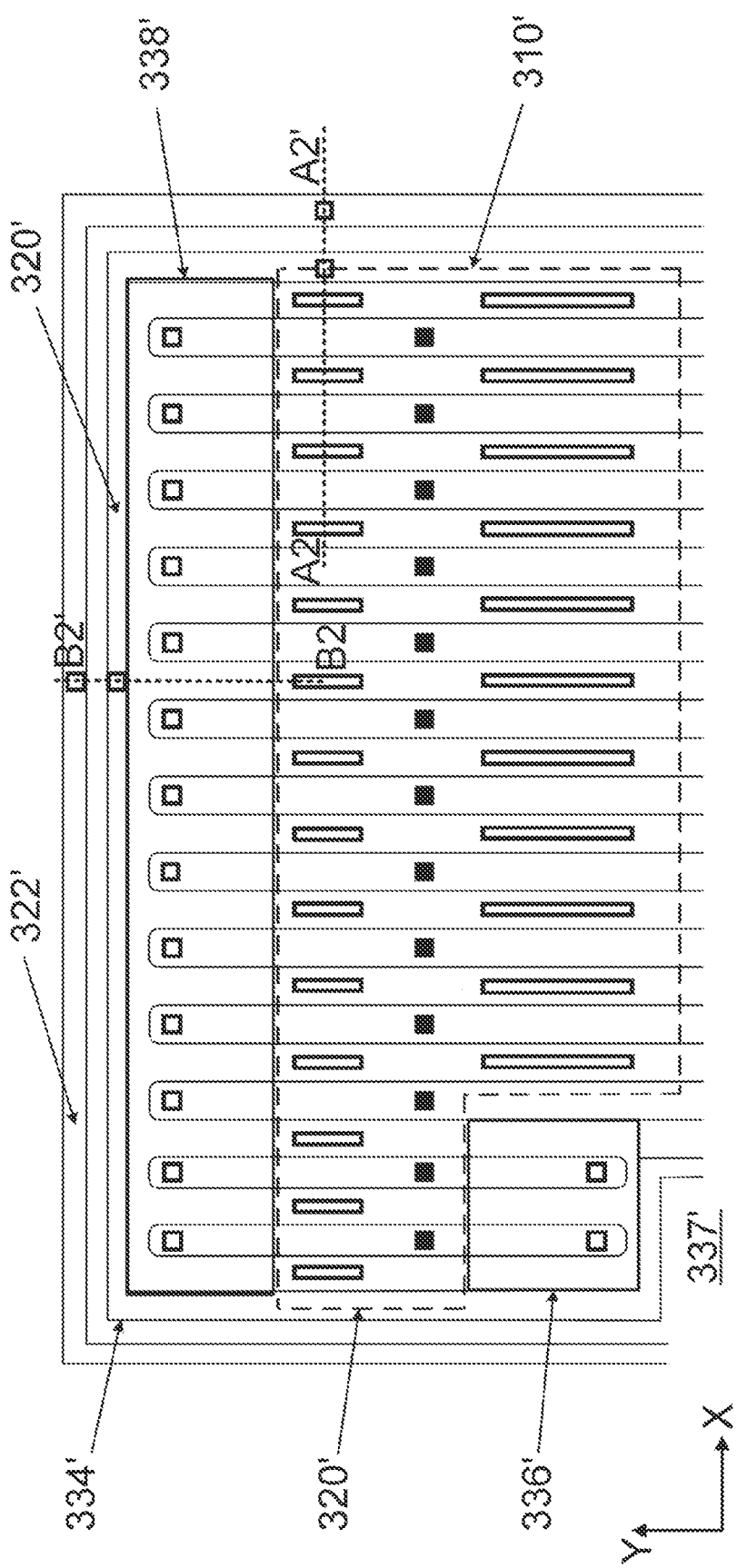
FIG. 3B is a top view of another preferred embodiment of an SGT MOSFET according to the present invention.

Please refer to FIG. 3B for a top view of another preferred embodiment for an SGT semiconductor power device as an enlarged portion of FIG. 3A according to the present invention, wherein the SGT semiconductor power device comprises a termination area 334' including a first termination trench 320' and a second termination trench 322', a first type electric field reducing regions (EFRR) 336' (inside a solid line box 336' near a gate metal pad 337') and 338' (inside a solid line box 338') wherein the first body regions are not formed. The first type electric field reducing regions 336' and 338' are formed between the first termination trench 320' and the first type P body regions 310' (inside a dashed line box).

Figure 1A:
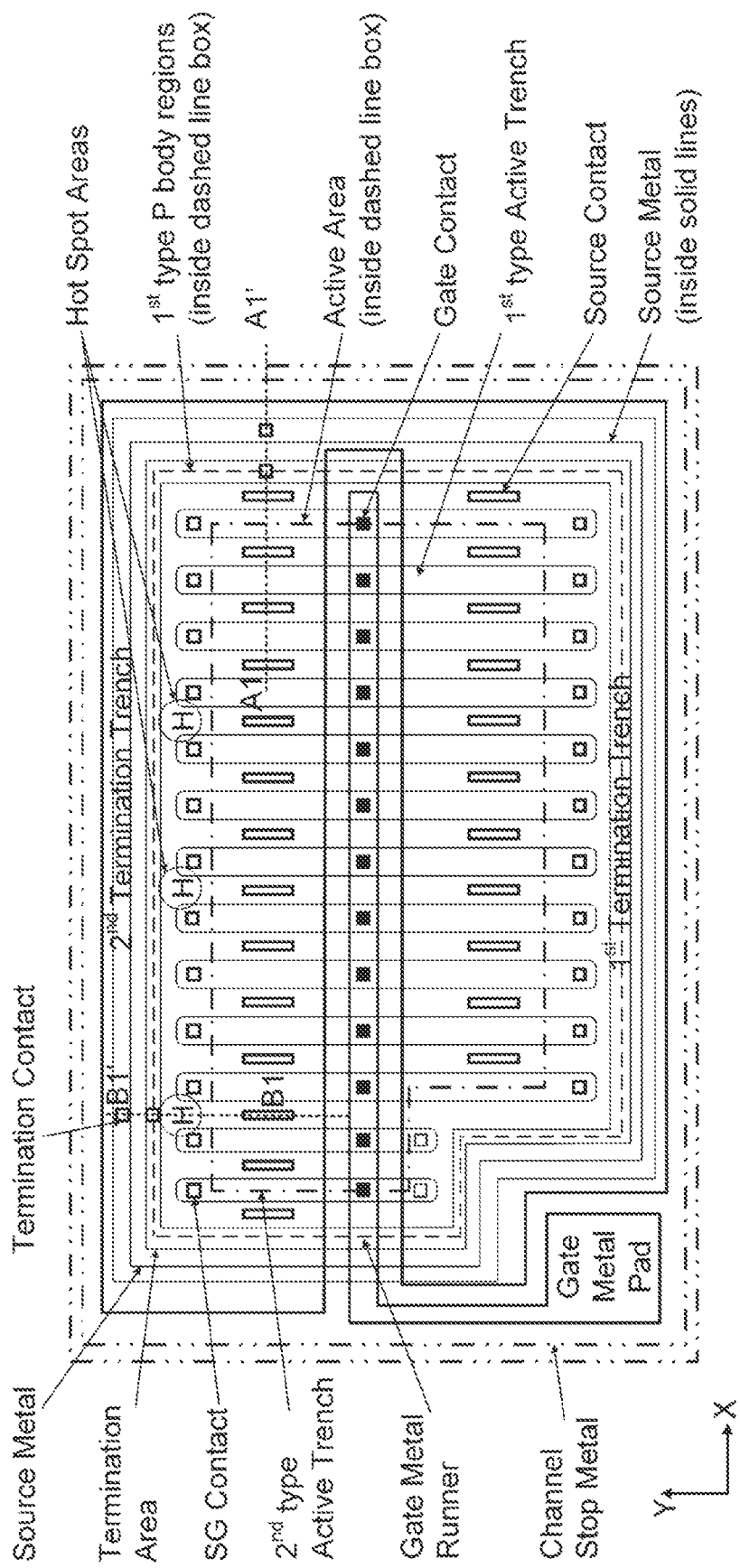
FIG. 1A is a top view of a conventional SGT MOSFET.
Figure 1B:
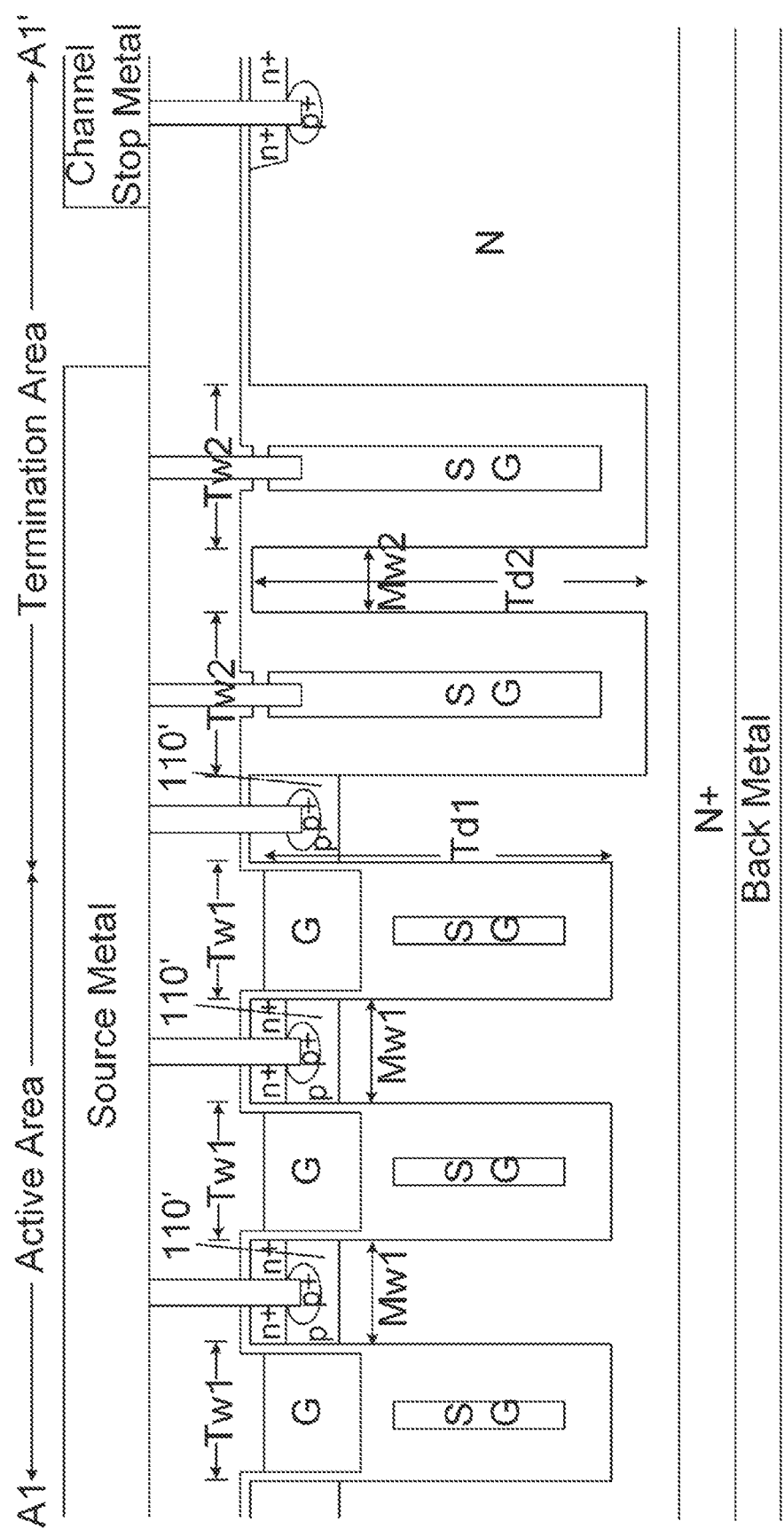
FIG. 1B is a conventional cross-sectional view along A1-A1' line of FIG. 1A.
Figure 3C:
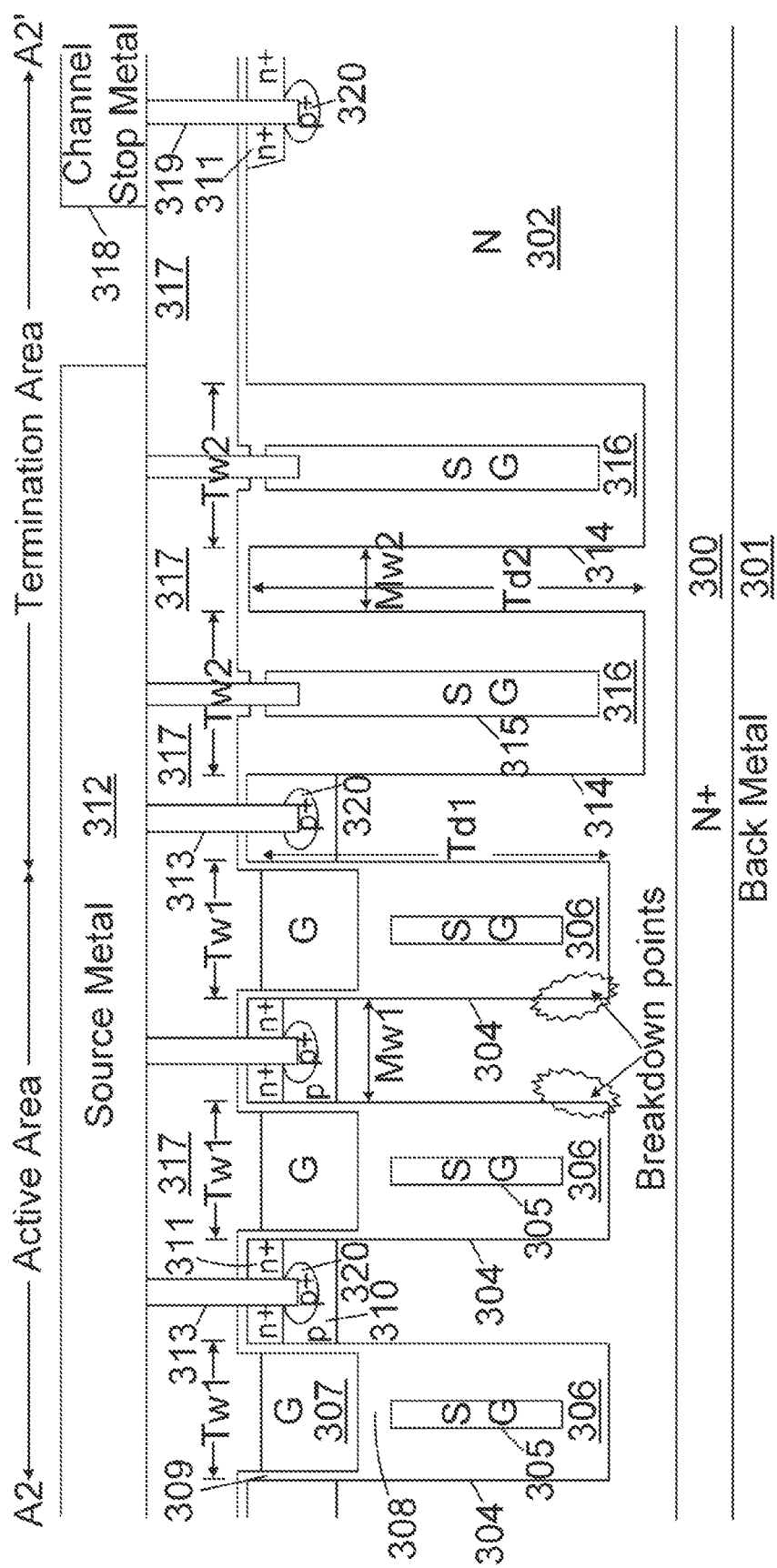
FIG. 3C is a cross-sectional view along A2-A2' line of FIGS. 3A and 3B with marked breakdown points.

Please refer to FIG. 3C for a cross-sectional view showing a preferred A2-A2' cross section of FIG. 3A and FIG. 3B, which is same as the conventional cross-sectional view shown in FIG. 1B showing a preferred A1-A1' cross section of FIG. 1A with marked breakdown points, wherein a uniform avalanche breakdown is maintained due to oxide charge balance. The preferred embodiment of this invention comprises an active area and a termination area with a single N type epitaxial layer 302 with a uniform doping concentration. The device comprises an N-channel SGT MOSFET formed in an N type epitaxial layer 302 onto an N+ substrate 300 coated with a back metal 301 of Ti/Ni/Ag on rear side as a drain metal. Inside each of the gate trenches 304 in the active area, a shielded gate electrode (SG as illustrated) 305 is disposed in the lower portion and a single gate electrode (G as illustrated) 307 is disposed in the upper portion above the shielded gate electrode 305. The shielded gate electrode 305 is insulated from the adjacent epitaxial layer by a first insulating film 306, and the gate electrodes 307 is insulated from the adjacent epitaxial layer by a gate oxide 309, wherein the gate oxide 309 has a thinner thickness than the first insulating film 306 which has a uniform thickness along trench sidewalls, meanwhile, the shielded gate electrode 305 and the gate electrode 307 is insulated from each other by an IPO film 308. Between every two adjacent gate trenches 304. P body regions 310 with n+ source regions 311 thereon are extending near top surface of the N epitaxial layer 302. The P body regions 310, the n+ source regions 311 and the shielded gate electrodes 305 are further shorted together to a source metal 312 through a plurality of trenched contacts 313 filled with contact plugs and barriers implemented by penetrating through a contact insulating layer 317 and extending into the P body regions 310. The source trenched contacts 313 are surrounded by p+ heavily doped regions 320 around bottoms underneath the n+ source regions 311. In the N epitaxial layer 302, outside the edge of the active area including the termination area, a p+ body contact doped region 320 is formed surrounding at least bottom of the trenched source-body contacts 313 without n+ source region 311. The source regions 311 and the P body regions 310 in the active area are not disposed between two adjacent of the edge trenches 314 in the termination area. Inside each of the edge trenches 314, a trench field plate 315 is disposed and insulated from the adjacent epitaxial layer by a second insulating film 316, wherein the trench width TW2 of the edge trench 314 is greater than or equal to the trench width Tw1 of the gate trench 304 in the active area (Tw2≥Tw1), and the trench depth Td2 of the edge trench 314 is greater than or equal to the trench depth Td1 of the gate trench 304 in the active area (Td2≥Td1). The mesa width between two adjacent of the gate trenches 304 is equal to or larger than that between two adjacent of the edge trenches 314 (Mw1≥Mw2). Moreover, in the termination area, a channel stop metal 318 is connected with the n+ source region 311, the N epitaxial layer 302, and a p+ body contact doped region 320 through a trenched channel stop contact 319.

Figure 3D:
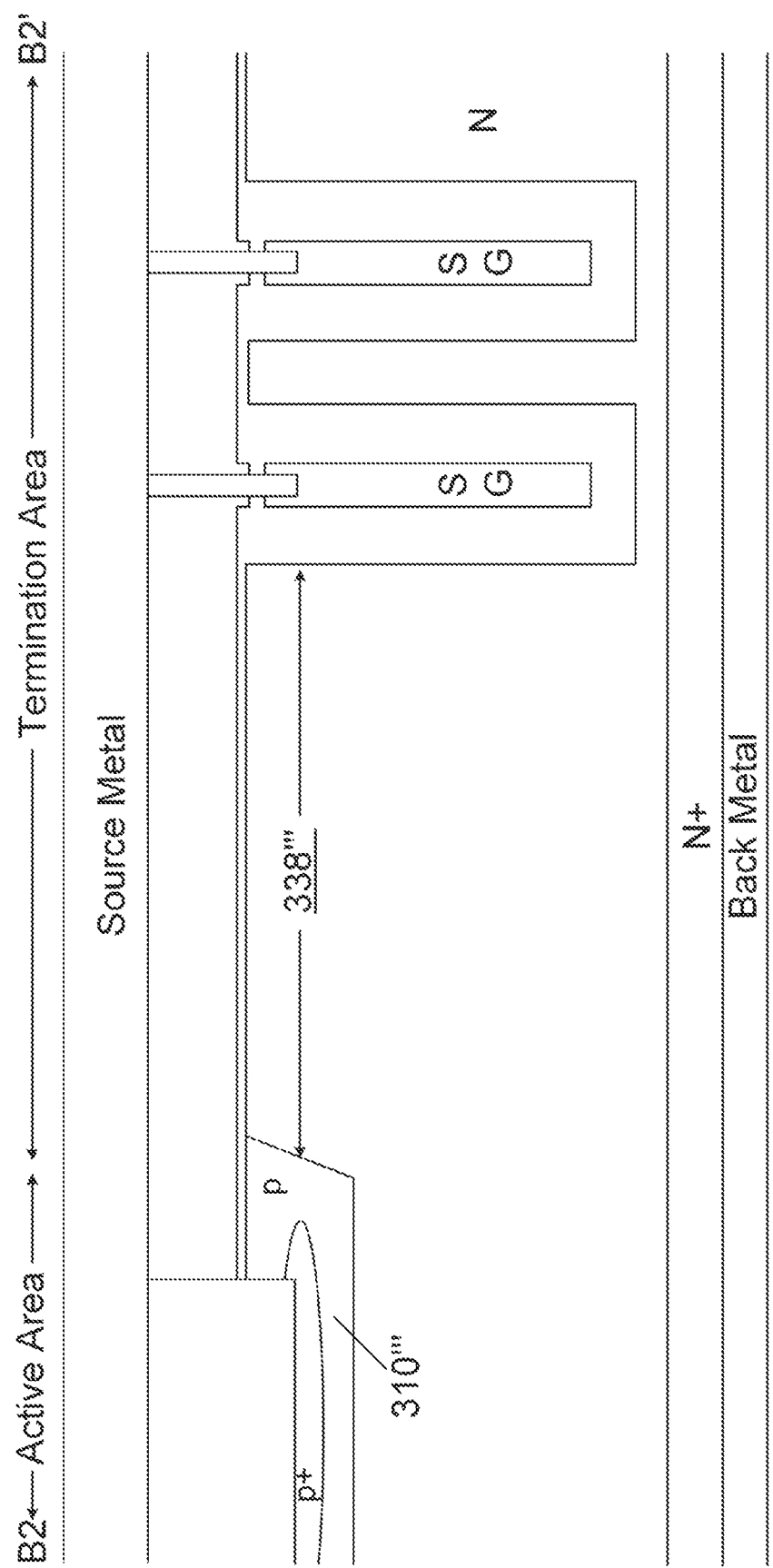
FIG. 3D is a cross-sectional view along B2-B2' line of FIG. 3B according to the present invention.

Please refer to FIG. 3D for a cross-sectional view showing a preferred B2-B2' cross section of FIG. 3B with a first type electric field reducing region 338''' and a first type P body regions 310''' according to the present invention. As the first type P body regions are absent in the first type electric field reducing region early avalanche breakdown at P/N junction near the first termination trench is avoided.

Figure 4A:
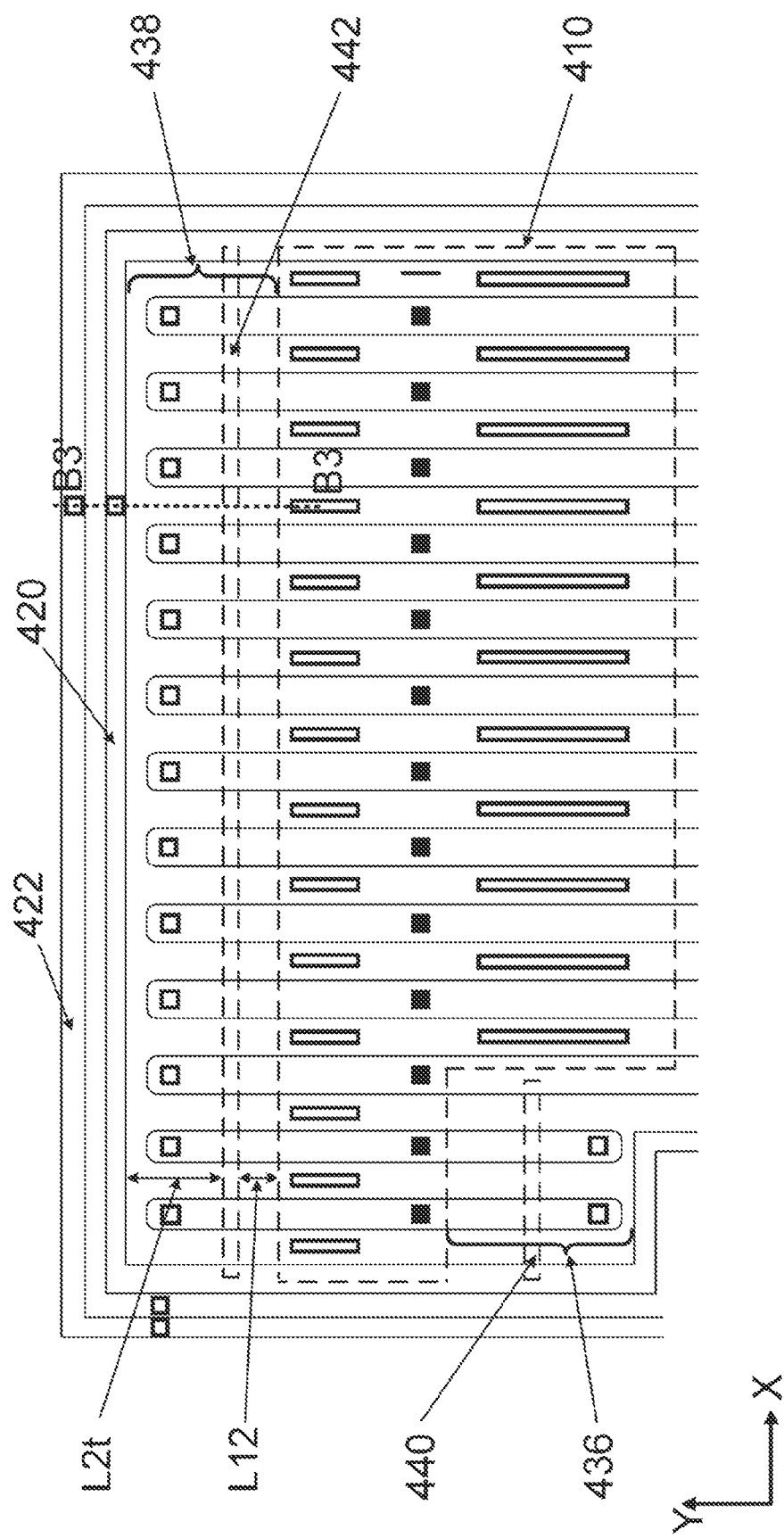
FIG. 4A is a top view of another preferred embodiment for an SGT MOSFET according to the present invention.

Please refer to FIG. 4A for a top view of another preferred embodiment for an SGT semiconductor power device according to the present invention, wherein the SGT semiconductor power device comprises a first termination trench 420, a second termination trench 422, a first type electric field reducing region 436 and 438, a first type P body regions 410 (inside a dashed line box), a second type body regions 440 and 442 (inside dashed line boxes denoted by 440 and 442, respectively) with floating voltages, wherein the second type P body regions 442 are spaced apart from the first termination trench 420 with a distance L2t and from the first type P body regions 410 with a distance L12.

Figure 4B:
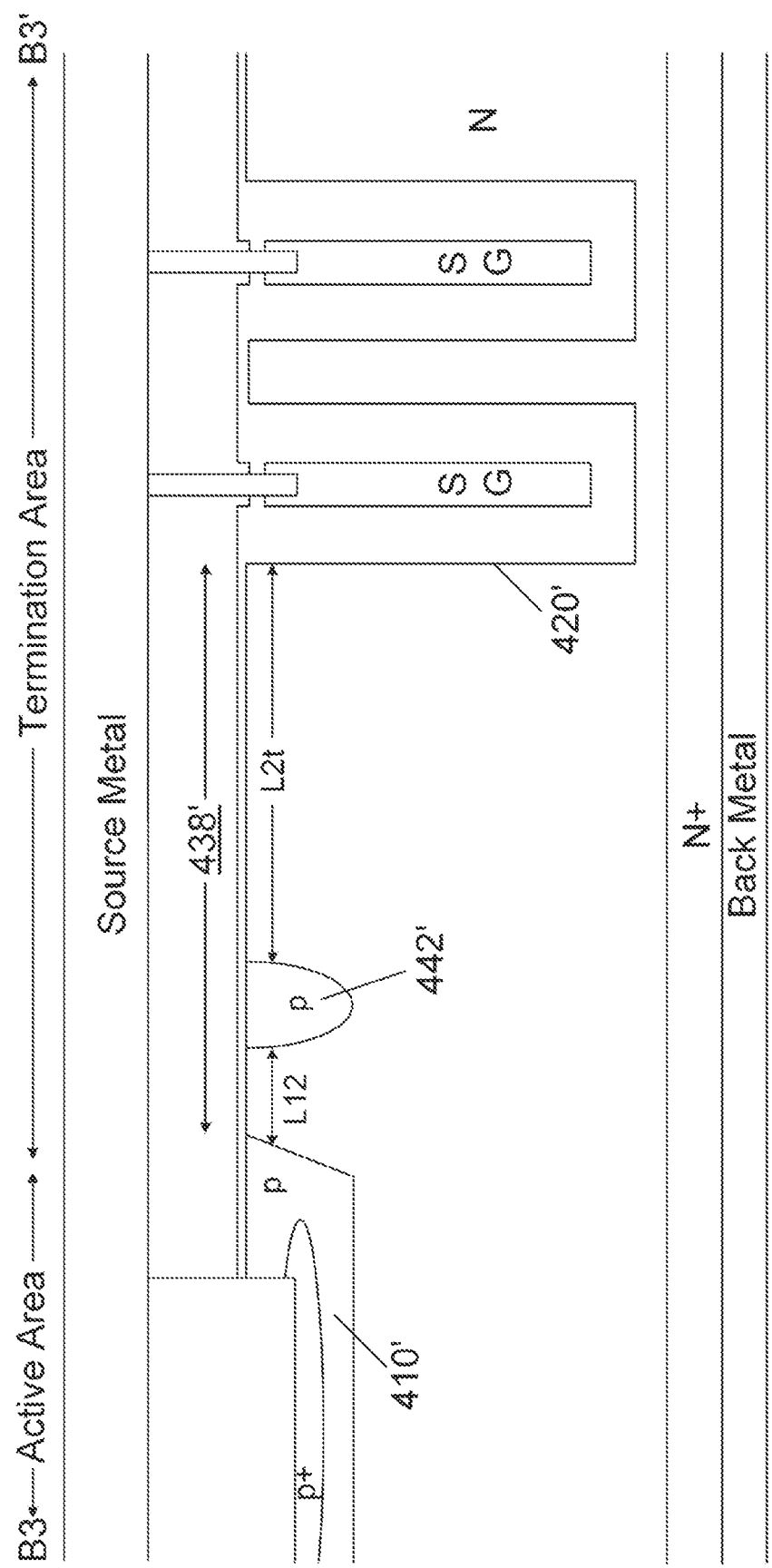
FIG. 4B is a cross-sectional view along B3-B3' line of FIG. 4A according to the present invention.

Please refer to FIG. 4B for a cross-sectional view showing a preferred B3-B3' cross section of FIG. 4A according to the present invention. The semiconductor power device has a similar structure to FIG. 3D, except that in FIG. 4B, one second type P body region 442' with a floating voltage is formed between the first type P body regions 410' and the termination trench 420' for breakdown voltage enhancement. Moreover, the second type P body region 442' is spaced apart from the first type body regions 410' with a distance L12 and from the termination trench 420' with a distance L2t.

Figure 5A:
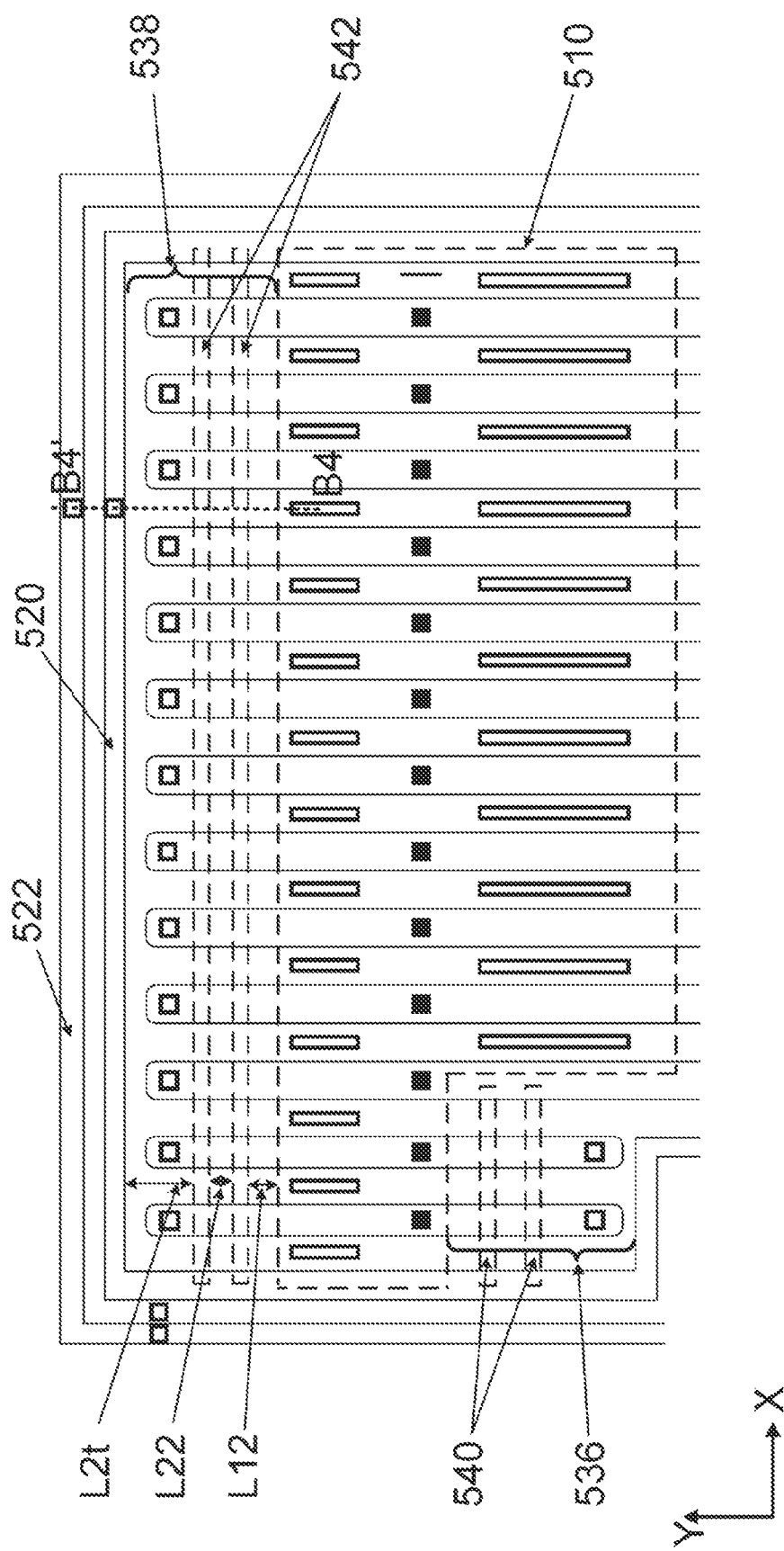
FIG. 5A is a top view of another preferred embodiment of an SGT MOSFET according to the present invention.

Please refer to FIG. 5A for a top view of another preferred embodiment for an SGT semiconductor power device according to the present invention, wherein the SGT semiconductor power device comprises a first termination trench 520, a second termination trench 522, a first type electric field reducing region 536 and 538, a first type P body regions 510 (inside a dashed line box), two second type body regions 540 and 542 with floating voltages (denoted by dashed line boxes 540 and 542 respectively), wherein one of the two second type P body regions 542 is spaced apart from the first termination trench 520 with a distance L2t and the other from the first type P body regions 510 with a distance L12, and a distance between the two second type P body regions 542 is L22.

Figure 5B:
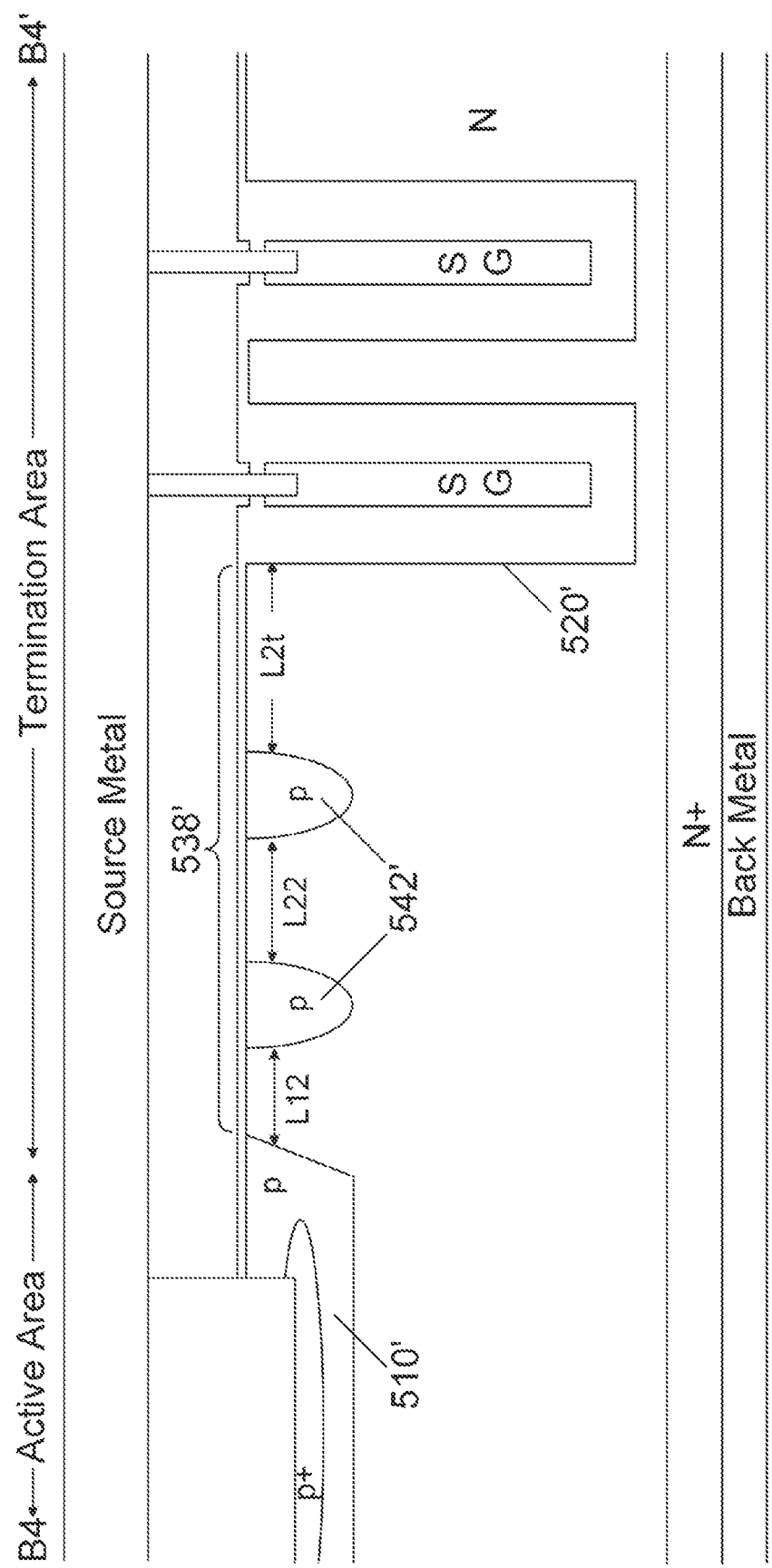
FIG. 5B is a cross-sectional view along B4-B4' line of FIG. 5A according to the present invention.

Please refer to FIG. 5B for a cross-sectional view showing a preferred B4-B4' cross section of FIG. 5A according to the present invention. The semiconductor power device has a similar structure to FIG. 4B, except that in FIG. 5B, two second type P body regions 542' with floating voltages are formed between the first type P body regions 510' and the termination trench 520' for breakdown voltage enhancement. Moreover, one of the two second type P body regions 542' is spaced apart from the first type body regions 510' with a distance L12 and the other from the termination trench 520' with a distance L2t, and the distance between the two adjacent second type P body regions 542' is L22.

Figure 6A:
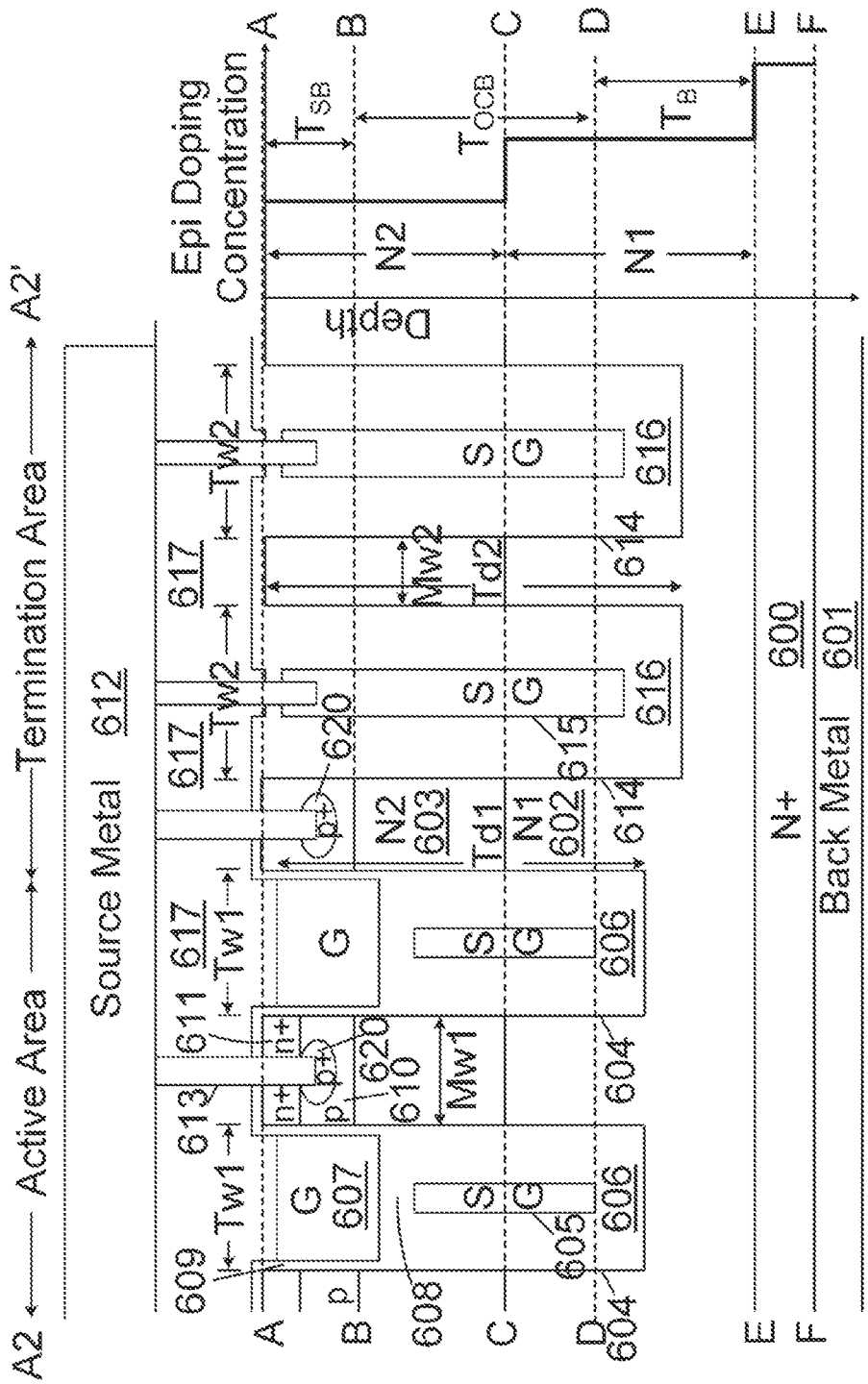
FIG. 6A is a cross-sectional view along A2-A2' line of FIG. 3B wherein the doping concentration variations are depicted along the vertical direction according to the present invention.

Please refer to FIG. 6A for another preferred A2-A2' cross section of FIG. 3B having an active area and a termination area with two stepped epitaxial layers, wherein the doping concentration variations are depicted along the vertical direction according to the present invention. The N-channel trenched semiconductor power device has a similar structure to FIG. 3C, except for the different epitaxial layers. In FIG. 6A, the device comprises an N-channel SGT MOSFET formed in an N type epitaxial layer onto an N+ substrate 600 coated with a back metal 601 of Ti/Ni/Ag on rear side as a drain metal. An OCB region $T_{OCB}$ is formed between two adjacent of gate trenches 604 below the body regions 610 and above a bottom of the shielded gate electrode 605 (between B-B and D-D lines), and a buffer region $T_B$ is formed between the N+ substrate 600 and a bottom of the shielded gate electrode 605 (between D-D and E-E Lines). The N type epitaxial layer comprises a bottom first epitaxial layer (N1, as illustrated between C-C and E-E lines) 602 with a doping concentration D1 and a top second epitaxial layer (N2, as illustrated between A-A and C-C lines) 603 above the bottom first epitaxial layer 602 with a doping concentration D2, wherein D2<D1, to increase the breakdown voltage and lower the specific on-resistance. The bottom first epitaxial layer 602 is disposed on the N+ substrate 600 and extends above the buffer region $T_B$. The epitaxial layer in the buffer region has a doping concentration same as the doping concentration D1 of the bottom first epitaxial layer 602. Inside the N type epitaxial layer, a plurality of gate trenches 604 in the active area and edge trenches 614 in the termination area are formed extending from a top surface of the top second epitaxial layer 603 and vertically downward into the bottom first epitaxial layer 602, wherein trench bottoms of the gate trenches 604 and edge trenches 614 are above a common interface between the N+ substrate 600 and the bottom first epitaxial layer 602. Inside each of the gate trenches 604 in the active area, a shielded gate electrode (SG as illustrated) 605 is disposed in the lower portion and a single gate electrode (G, as illustrated) 607 is disposed in the upper portion above the shielded gate electrode 605. The shielded gate electrode 605 is insulated from the adjacent epitaxial layer by a first insulating film 606, and the gate electrodes 607 is insulated from the adjacent epitaxial layer by a gate oxide 609, wherein the gate oxide 609 has a thinner thickness than the first insulating film 606 which has a uniform thickness along trench sidewalls, meanwhile, the shielded gate electrode 605 and the gate electrode 607 is insulated from each other by an IPO film 608. Between every two adjacent gate trenches 604, the P body regions 610 with n+ source regions 611 thereon are extending near top surface of the top second epitaxial Layer 603 to form source regions and body regions $T_{SB}$ between A-A and B-B lines. The P body regions 610, the n+ source regions 611 and the shielded gate electrodes 605 are further shorted together to a source metal 612 through a plurality of trenched contacts 613 filled with contact plugs and barriers implemented by penetrating through a contact insulating layer 617 and surrounded by p+ heavily doped regions 620 around bottoms underneath the n+ source regions 611. In the top second epitaxial layer 603, outside the edge of the active area including the termination area, a p+ body contact doped region 620 is formed surrounding at least bottom of the trenched source-body contact 613 without n+ source region 611. The source regions 611 and the P body regions 610 in the active area are not disposed between two adjacent of the edge trenches 614 in the termination area. Inside each of the edge trenches 614, a trench field plate 615 is disposed and insulated from the adjacent epitaxial layer by a second insulating film 616, wherein the trench width Tw2 of the edge trench 614 is greater than or equal to the trench width Tw1 of the gate trench 604 in the active area (Tw2≥Tw1), and the trench depth Td2 of the edge trench 614 is greater than or equal to the trench depth Td1 of the gate trench 604 in the active area (Td2≥Td1). The mesa width between two adjacent of the gate trenches 604 is equal to or larger than that between two adjacent of the edge trenches 614 (Mw1≥Mw2).

Figure 6B:
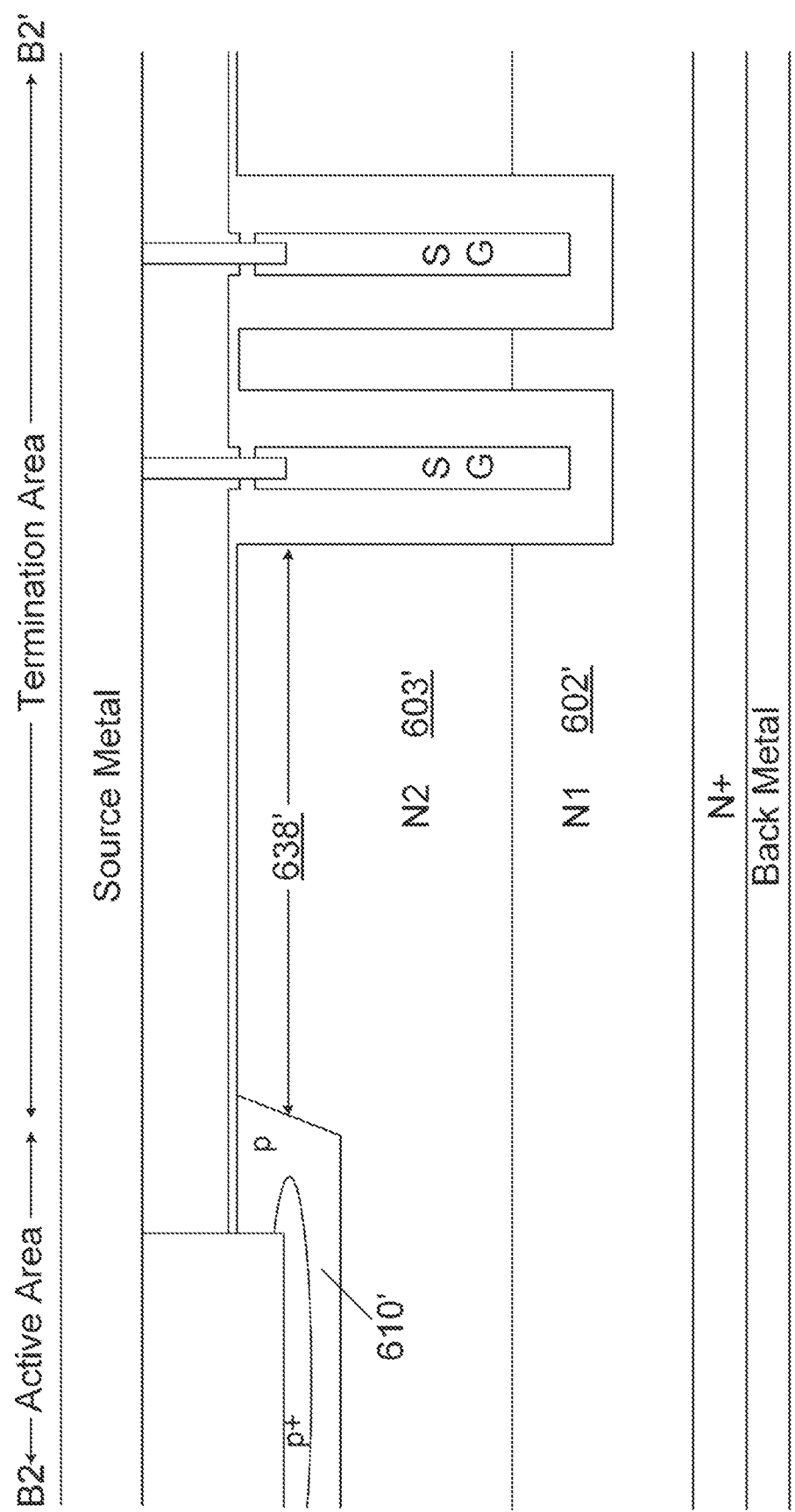
FIG. 6B is a cross-sectional view along B2-B2' line of FIG. 3B according to the present invention.

Please refer to FIG. 6B for a cross-sectional view showing another preferred B2-B2' cross section of FIG. 3B according to the present invention. The semiconductor power device has a similar structure to FIG. 3D, except for the different epitaxial layers. In FIG. 6B, the epitaxial layer comprises a bottom first epitaxial layer (N1, as illustrated) 602' with a doping concentration D1 and a top second epitaxial layer (N2, as illustrated) 603 with a doping concentration D2, wherein D2<D1, to increase the breakdown voltage and lower the specific on-resistance.

Figure 7A:
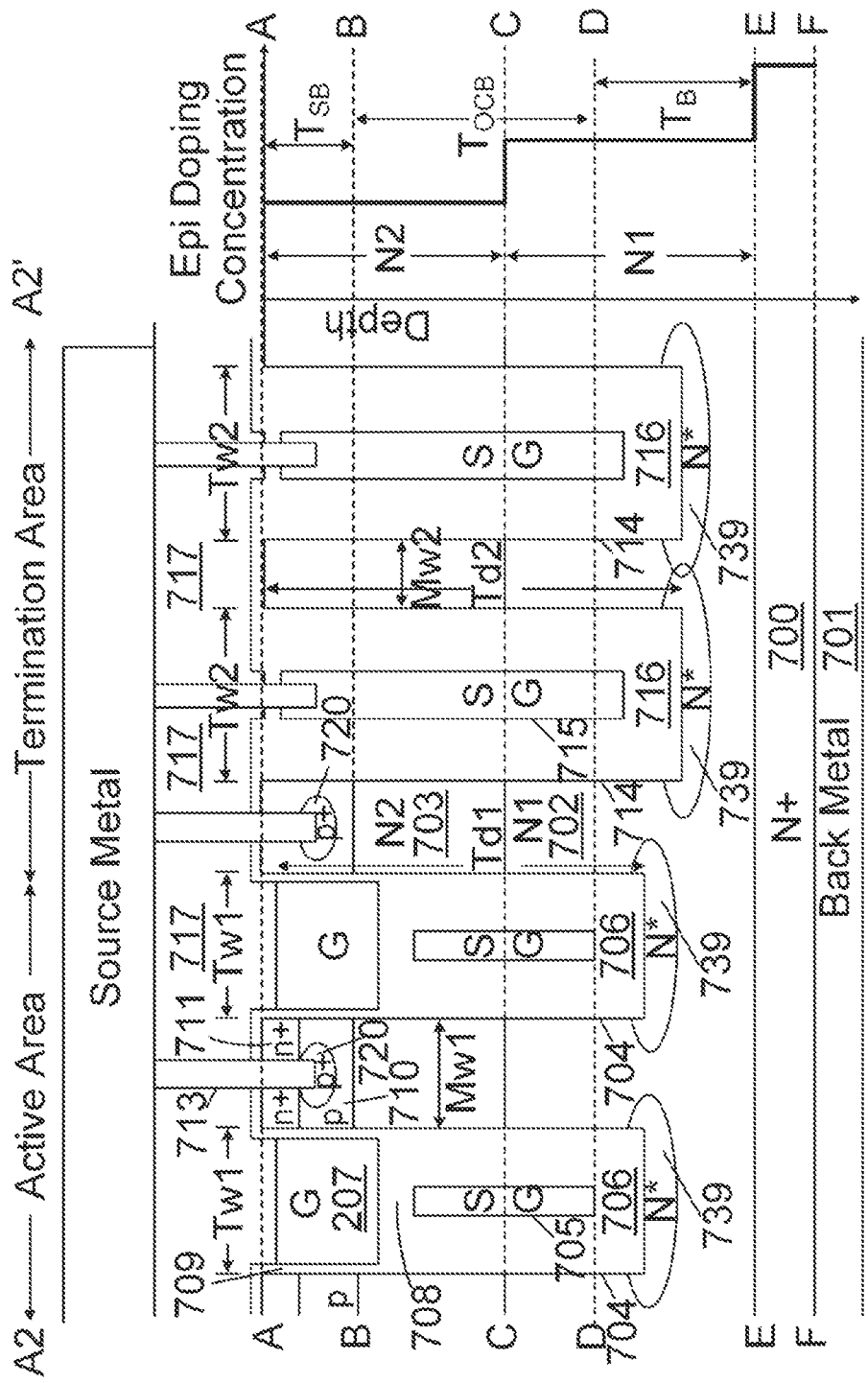
FIG. 7A is a cross-sectional view of another preferred embodiment along A2-A2' line of FIG. 3B wherein the doping concentration variations are depicted along the vertical direction according to the present invention.

Please refer to FIG. 7A for another preferred A2-A2' cross section of FIG. 3B having an active area and a termination area with two stepped epitaxial layers N1 and N2, wherein the doping concentration variations are depicted along the vertical direction according to the present invention. The N-channel trenched semiconductor power device has a similar structure to FIG. 6A, except that, in FIG. 7A, an N type electric field reducing region N* 739 with a doping concentration D* lower than the bottom first epitaxial layer N1 is disposed surrounding a bottom of each of gate trenches 704 in the active area and edge trenches 714 in the termination area as the second type electric field reducing region. The purpose of installation of the second type electric field reducing region 739 into the SGT device is to solve breakdown voltage degradation as a field oxide thickness at each bottom of the plurality of gate trenches is less than that at sidewalls.

Figure 7B:
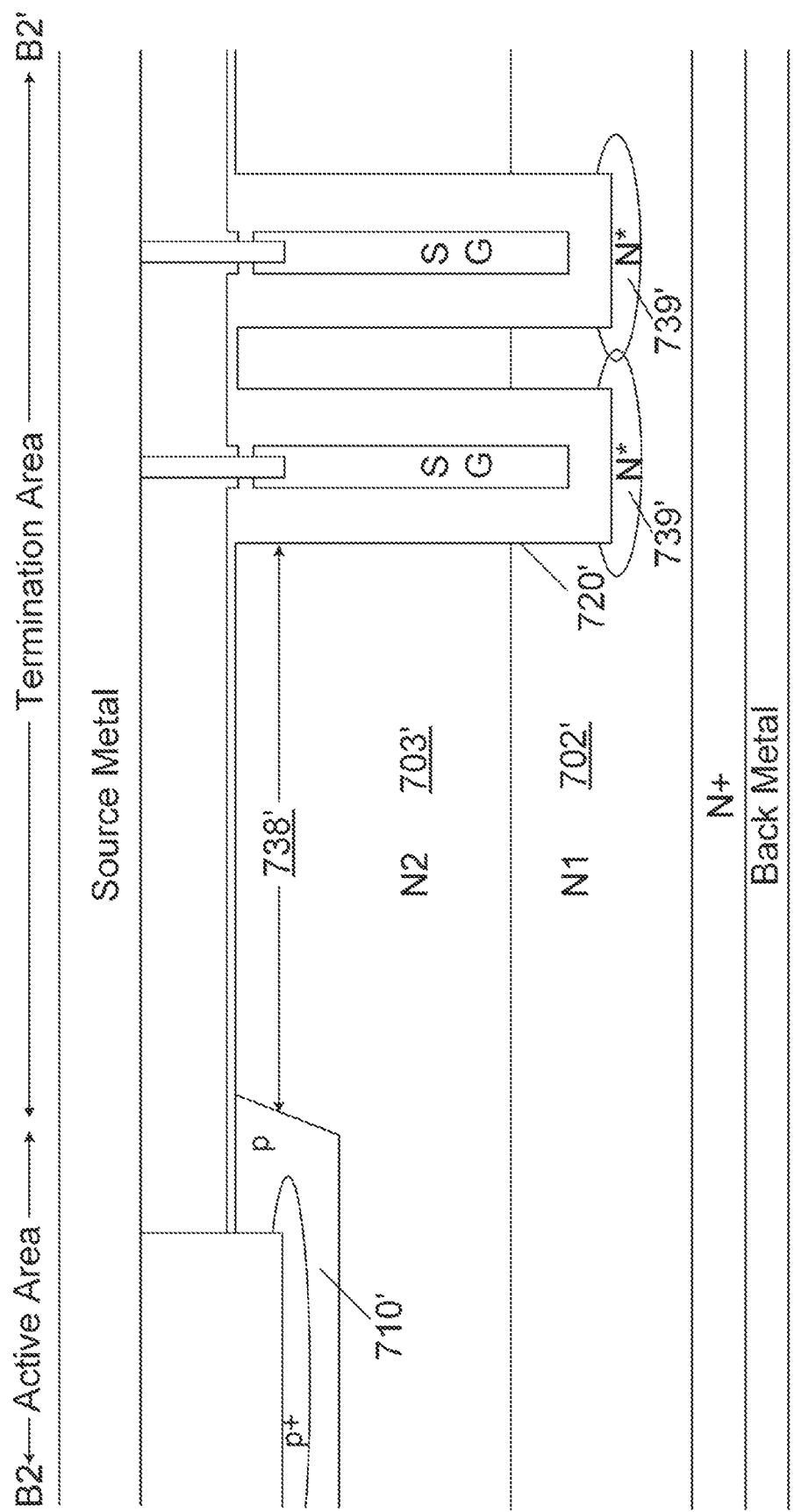
FIG. 7B is a cross-sectional view showing another preferred embodiment along B2-B2' line of FIG. 3B according to the present invention.

Please refer to FIG. 7B for a cross-sectional view showing another preferred B2-B2' cross section of FIG. 3B according to the present invention. The semiconductor power device has a similar structure to FIG. 6B, except that, in FIG. 7B, an N type electric field reducing region N* 739' with a doping concentration D* lower than the bottom first epitaxial layer N1 is disposed surrounding a bottom of termination trenches 720' in the termination area as the second type electric field reducing region.

Figure 8A:
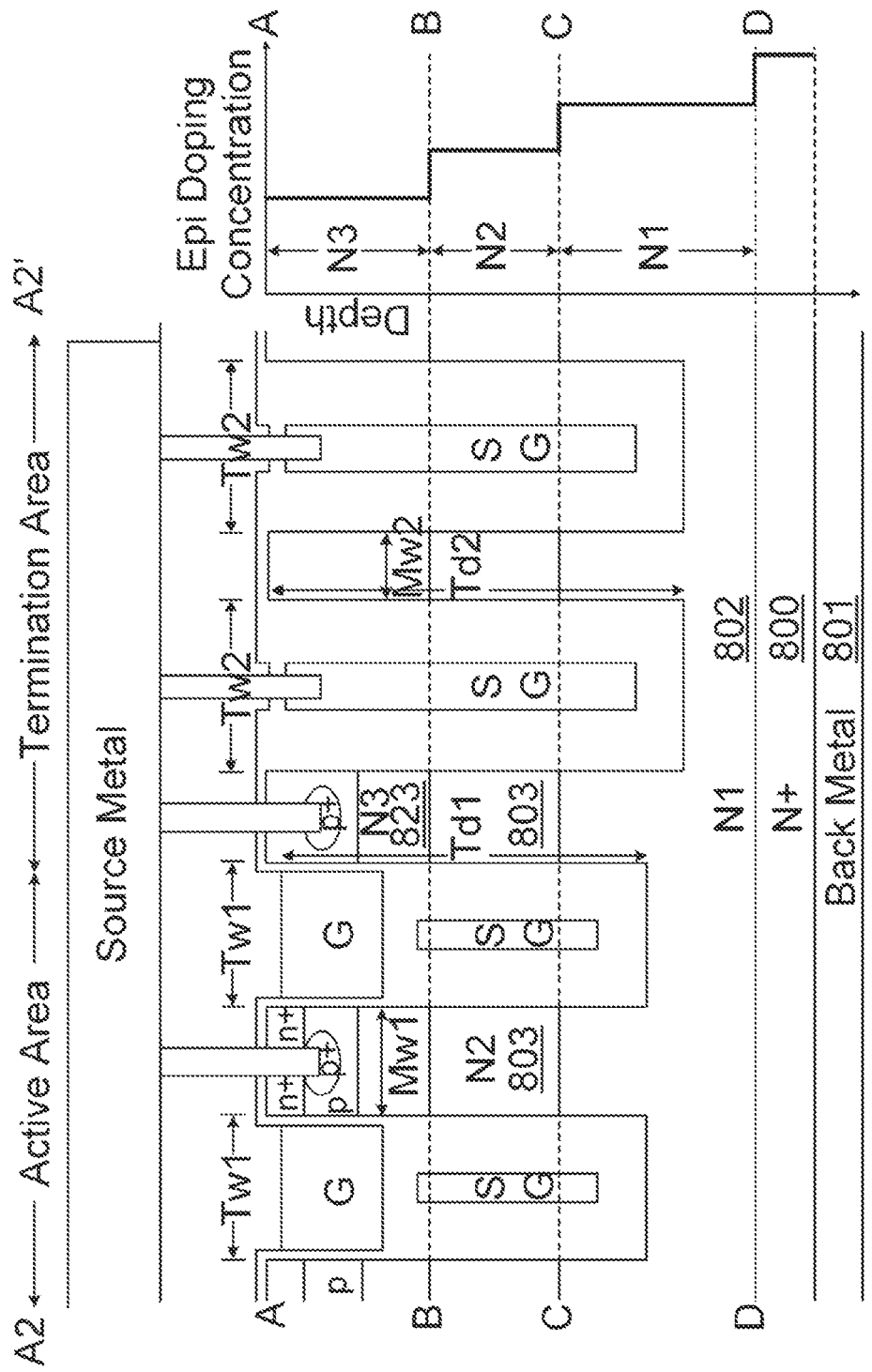
FIG. 8A is a cross-sectional view showing another preferred embodiment along A2-A2' line of FIG. 3B wherein the doping concentration variations are depicted along the vertical direction according to the present invention.

Please refer to FIG. 8A for another preferred A2-A2' cross section of FIG. 3B having an active area and a termination area with three stepped epitaxial layers, wherein the doping concentration variations are depicted along the vertical direction according to the present invention. The N-channel trenched semiconductor power device has a similar structure to FIG. 6A except that, in FIG. 8A, the N type epitaxial layer comprises three stepped epitaxial layers of different doping concentrations including a bottom first epitaxial layer (N1, as illustrated) 802 with a doping concentration D1, a middle second epitaxial layer (N2, as illustrated) 803 with a doping concentration D2 and a top 3$^{rd}$ epitaxial layer (N3, as illustrated) 823 with a doping concentration D3, wherein D3<D2<D1, to further reduce the specific on-resistance. The D2 can be an average of D1 and D3.

Figure 8B:
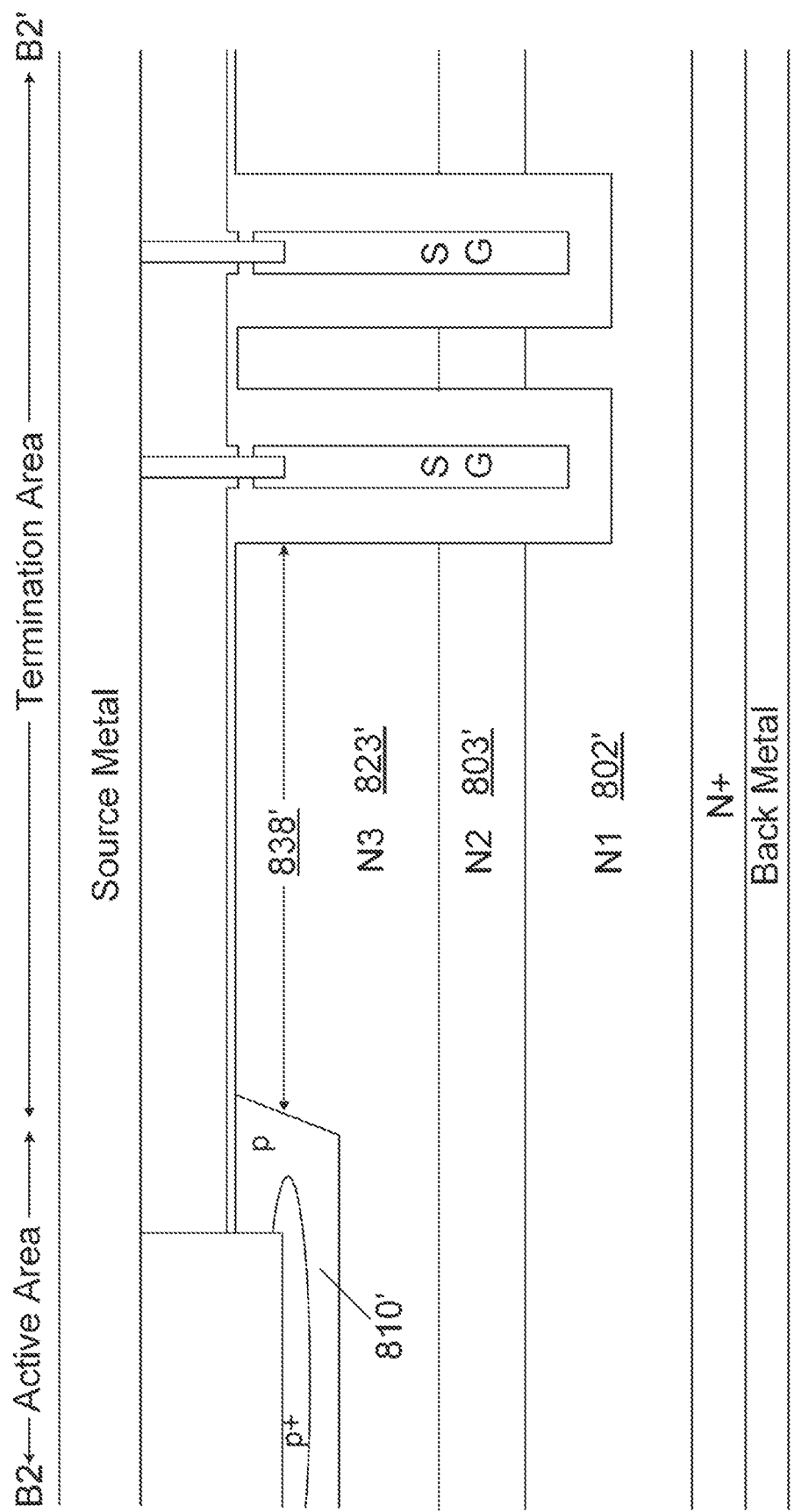
FIG. 8B is a cross-sectional view showing another preferred embodiment along B2-B2' line of FIG. 3B according to the present invention.

Please refer to FIG. 8B for a cross-sectional view showing another preferred B2-B2' cross section of FIG. 3B according to the present invention. The semiconductor power device has a similar structure to FIG. 6B, except for the different epitaxial layers. In FIG. 8B, the epitaxial layer comprises a bottom first epitaxial layer (N1, as illustrated) 802' with a doping concentration D1, a middle second epitaxial layer (N2, as illustrated) 803' with a doping concentration D2 and a top third epitaxial layer (N3, as illustrated) 823' with a doping concentration D3, wherein D3<D2<D1, to further reduce the specific on-resistance. The D2 can be an average of D1 and D3.

Figure 9A:
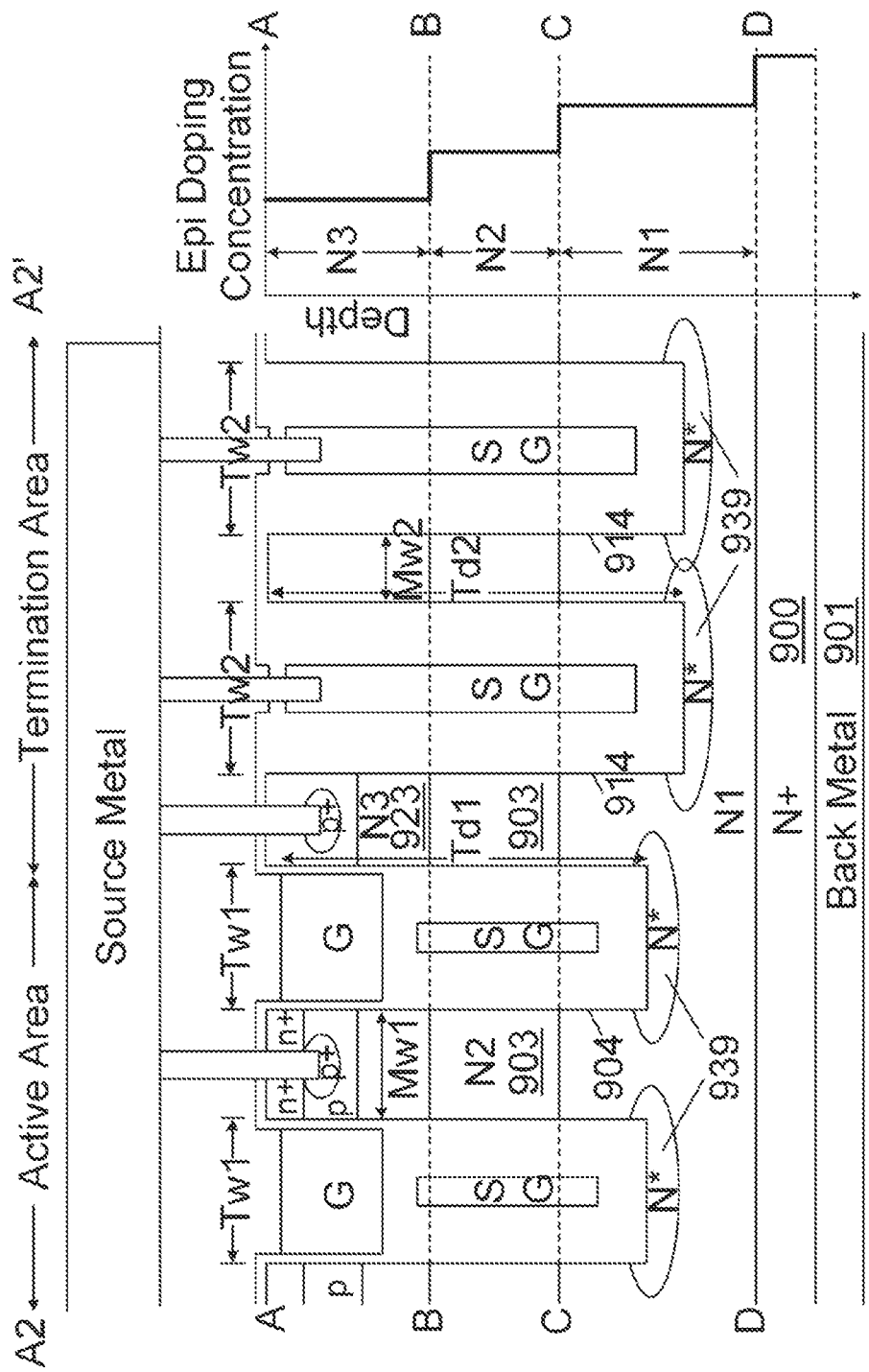
FIG. 9A is a cross-sectional view showing another preferred embodiment along A2-A2' line of FIG. 3B wherein the doping concentration variations are depicted along the vertical direction according to the present invention.

Please refer to FIG. 9A for another preferred A2-A2' cross section of FIG. 3B having an active area and a termination area with three stepped epitaxial layers, wherein the doping concentration variations are depicted along the vertical direction according to the present invention. The N-channel trenched semiconductor power device has a similar structure to FIG. 8A, except that, in FIG. 9A, an N type electric field reducing region N* 939 with a doping concentration D* is disposed surrounding a bottom of each of gate trenches 904 in the active area and edge trenches 914 in the termination area as the second type electric field reducing region. The purpose of installation of the second type electric field reducing region 939 into the SGT device is to solve breakdown voltage degradation as a field oxide thickness at each bottom of the plurality of gate trenches is less than that at sidewalls.

Figure 9B:
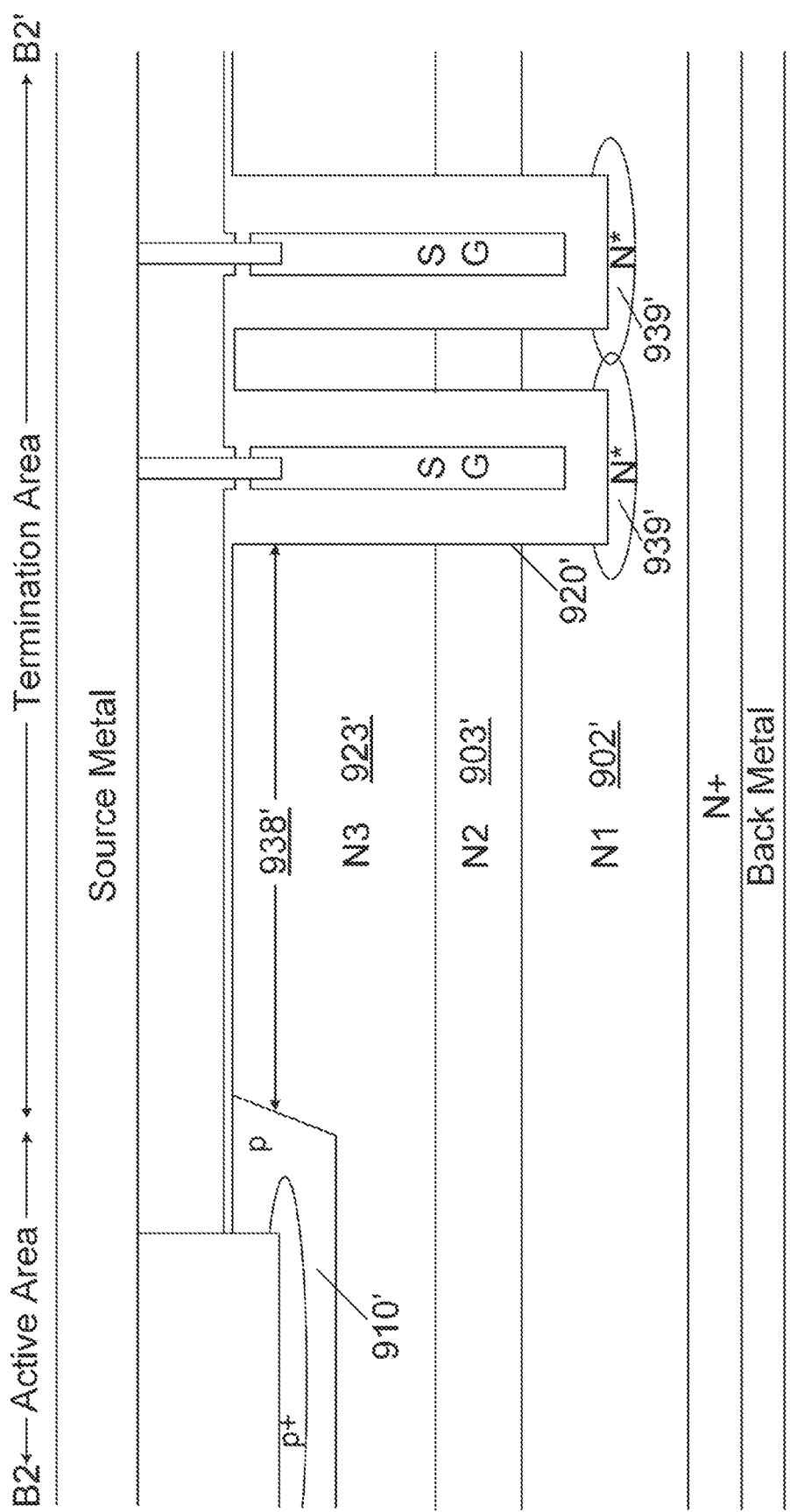
FIG. 9B is a cross-sectional view of another preferred embodiment along B2-B2' line of FIG. 3B according to the present invention.

Please refer to FIG. 9B for a cross-sectional view showing another preferred B2-B2' cross section of FIG. 3B according to the present invention. The semiconductor power device has a similar structure to FIG. 8B, except that, in FIG. 9B, an N type electric field reducing region N* 939' with a doping concentration D* is disposed surrounding a bottom of termination trenches 920' in the termination area as the second type electric field reducing region.

Figure 10:
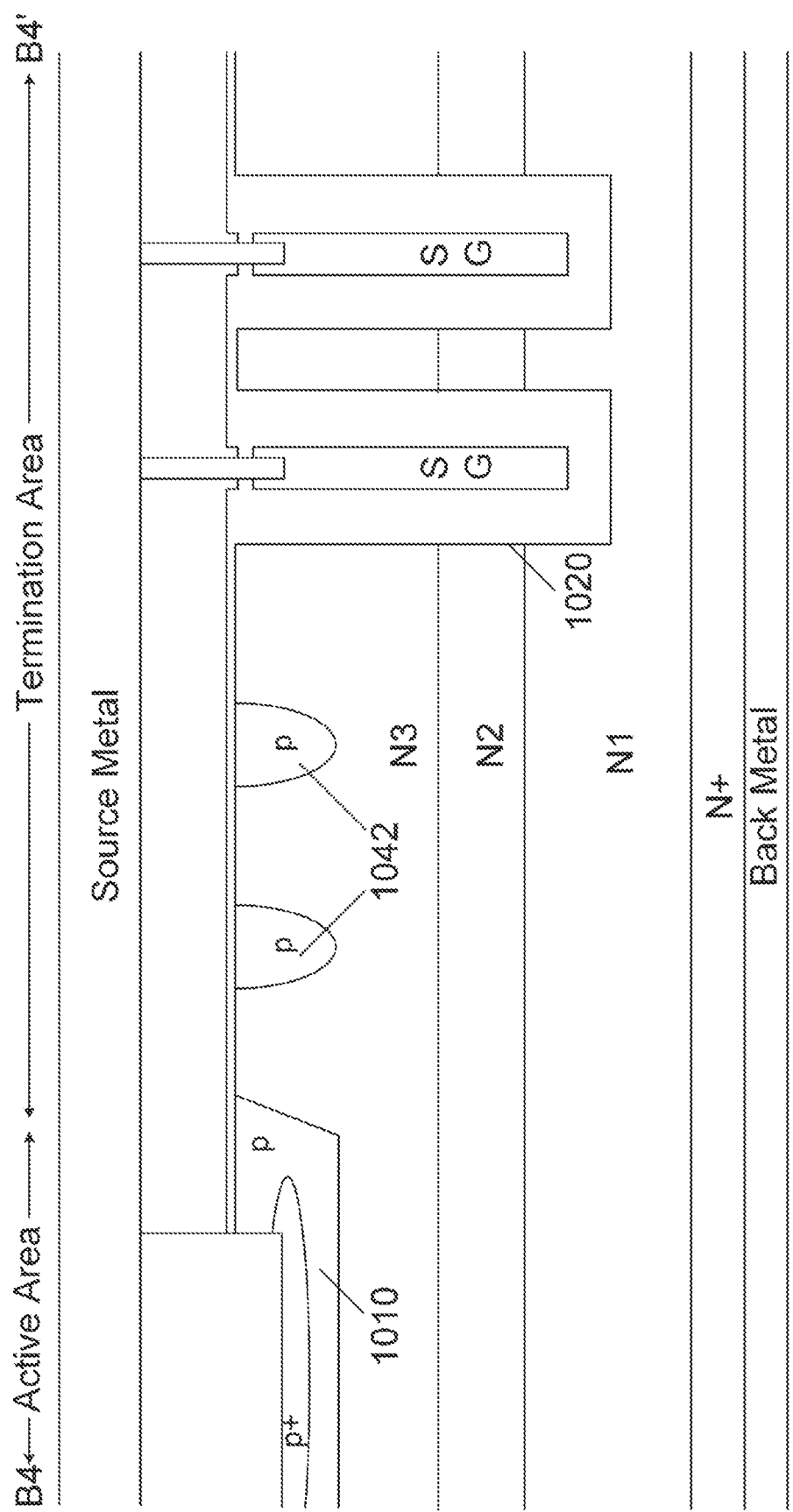
FIG. 10 is a cross-sectional view of another preferred embodiment along B4-B4' line of FIG. 5A according to the present invention.

Please refer to FIG. 10 for a cross-sectional view showing another preferred B4-B4' cross section of FIG. 5A according to the present invention. The semiconductor power device has a similar structure to FIG. 8B, except that, in FIG. 10, two second type P body regions 1042 with floating voltages are formed between the first type P body regions 1010 and the first termination trench 1020 for breakdown voltage enhancement.

Figure 1C:
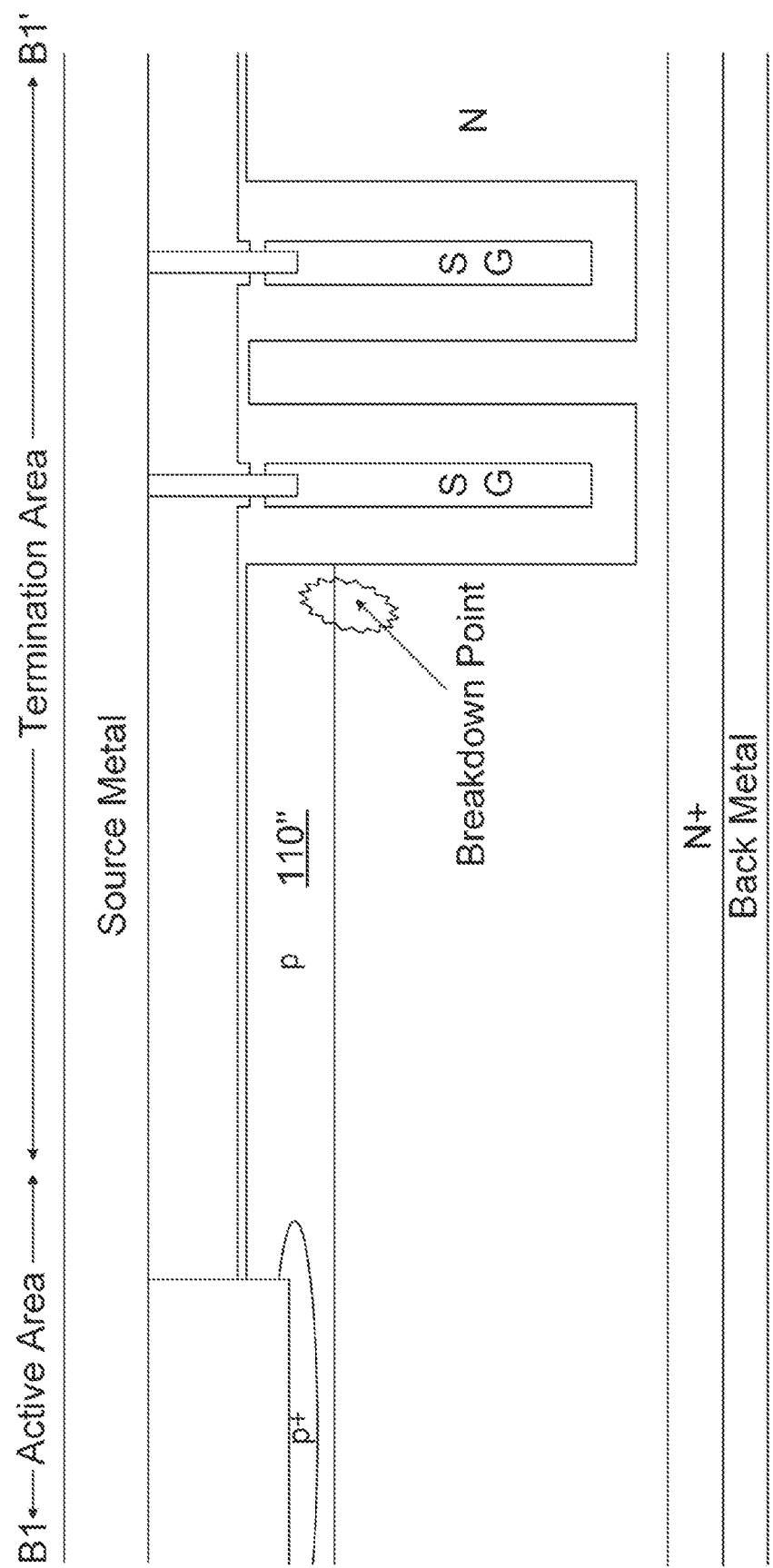
FIG. 1C is a conventional cross-sectional view along B1-B1' line of FIG. 1A.
Figure 11:
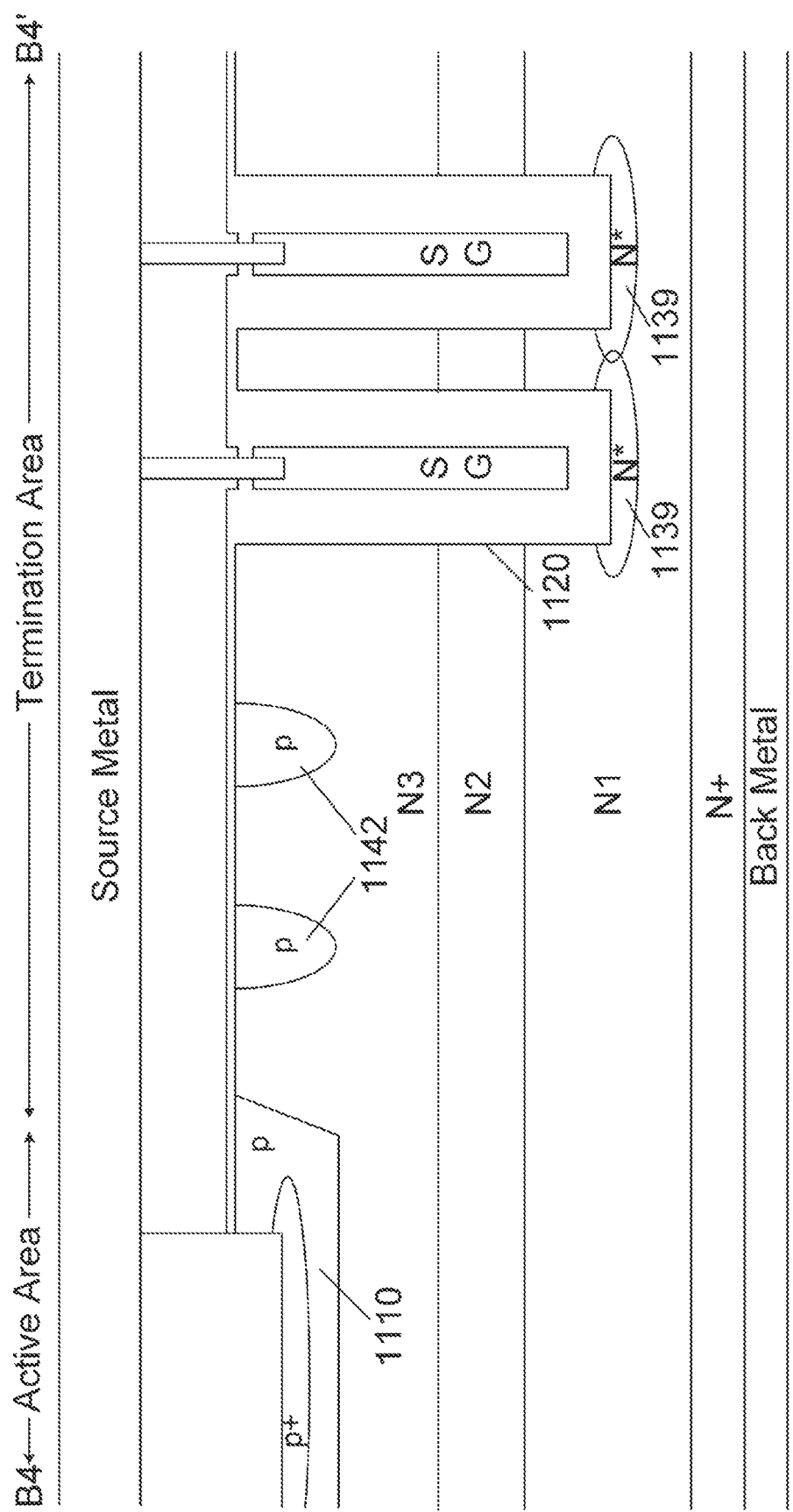
FIG. 11 is a cross-sectional view of another preferred embodiment along B4-B4' line of FIG. 5A according to the present invention.

Please refer to FIG. 1 for a cross-sectional view showing another preferred B4-B4' cross section of FIG. 5A according to the present invention. The semiconductor power device has a similar structure to FIG. 10, except that, in FIG. 11, an N type electric field reducing region N* 1139 with a doping concentration D* lower than the bottom first epitaxial layer N1 is disposed surrounding a bottom of termination trenches 1120 in the termination area as the second type electric field reducing region.

Figure 12A:
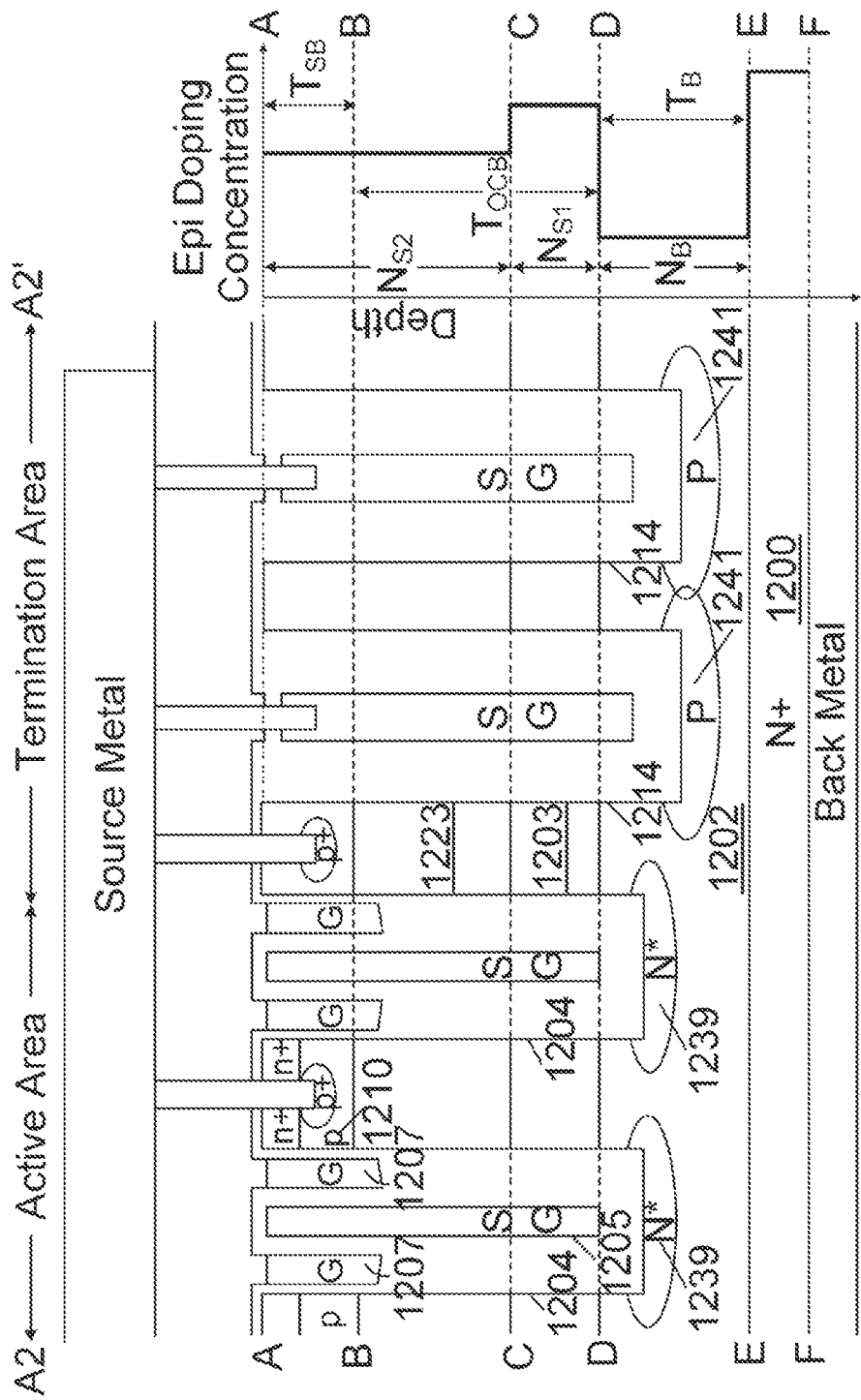
FIG. 12A is a cross-sectional view of another preferred embodiment along A2-A2' line of FIG. 3B wherein the doping concentration variations are depicted along the vertical direction according to the present invention.

Please refer to FIG. 12A for a cross-sectional view showing another preferred A2-A2' cross section of FIG. 3B having an active area and a termination area with three stepped epitaxial layers, wherein the doping concentration variations are depicted along the vertical direction according to the present invention. The N-channel trenched semiconductor power device has a similar structure to FIG. 9A, except for the different epitaxial layer structure, the different shielded gate structure in the gate trenches 1204 in the active area, and the different third type electric field reducing region 1241. In FIG. 12A, an OCB region T$_{OCB}$ is formed between two adjacent of the gate trenches 1204 below the body regions 1210 and above a bottom of the shielded gate electrode 1205 (between B-B and D-D lines), a buffer region T$_B$ is formed between the N+ substrate 1200 and a bottom of the shielded gate electrode 1205, the epitaxial layer in the OCB region T$_{OCB}$ has two stepped epitaxial layers with different doping concentrations including a bottom first epitaxial layer (N$_{S1}$, as illustrated between C-C and D-D lines) 1203 above a buffer epitaxial layer (N$_B$, as illustrated between D-D and E-E lines) 1202 with a doping concentration D1 and a top second epitaxial layer (N$_{S2}$, as illustrated between A-A and C-C lines) 1223 above the first epitaxial layer 1203 with a doping concentration D2, wherein D2<D1, and the epitaxial layer in source regions and body regions has a doping concentration same as the top second epitaxial layer 1223 in the OCB region T$_{OCB}$, and the buffer epitaxial layer 1202 has a doping concentration D$_B$ lower than the top second epitaxial layer 1223 in the OCB region T$_{OCB}$. Inside each of the gate trenches 1204, a shielded gate electrode (SG as illustrated) 1205 is disposed in the middle and gate electrode (Ci as illustrated) 1207 is disposed surrounding upper portions of the shielded electrode 1205. In the termination area, a P type electric field reducing region 1241 is disposed surrounding each bottom of the edge trenches 1214 as the third electric field reducing region for further reducing electric field strength.

Figure 12B:
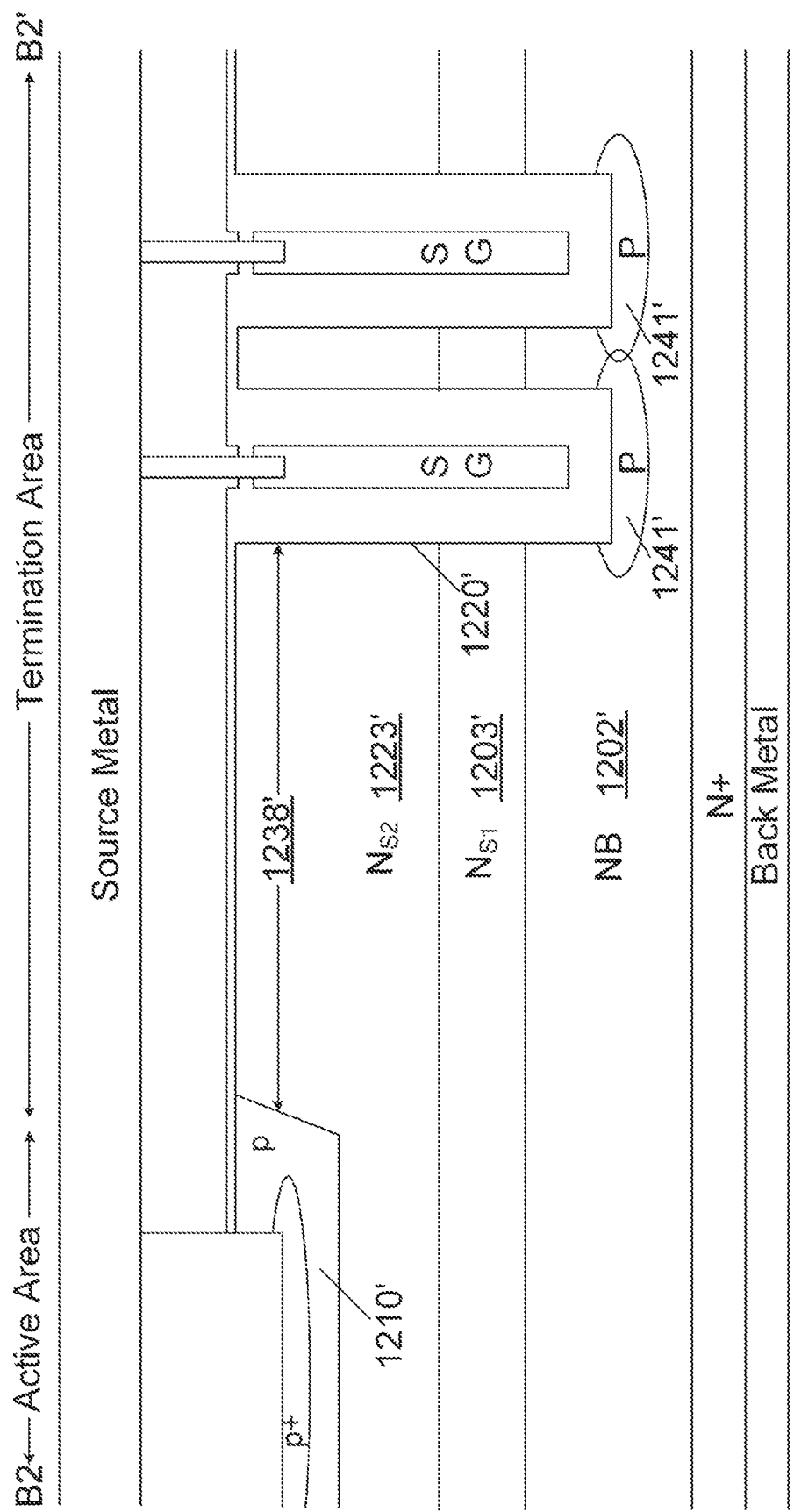
FIG. 12B is a cross-sectional view of another preferred embodiment along B2-B2' line of FIG. 3B according to the present invention.

Please refer to FIG. 12B for a cross-sectional view showing another preferred B2-B2' cross section of FIG. 3B according to the present invention. The semiconductor power device has the same epitaxial layer as FIG. 12A and a similar structure to FIG. 8B, except that, in FIG. 12B, a P type electric field reducing region 1241' is disposed surrounding a bottom of termination trenches 1220' in the termination area as the third electric field reducing region for further reducing electric field strength.

Figure 12C:
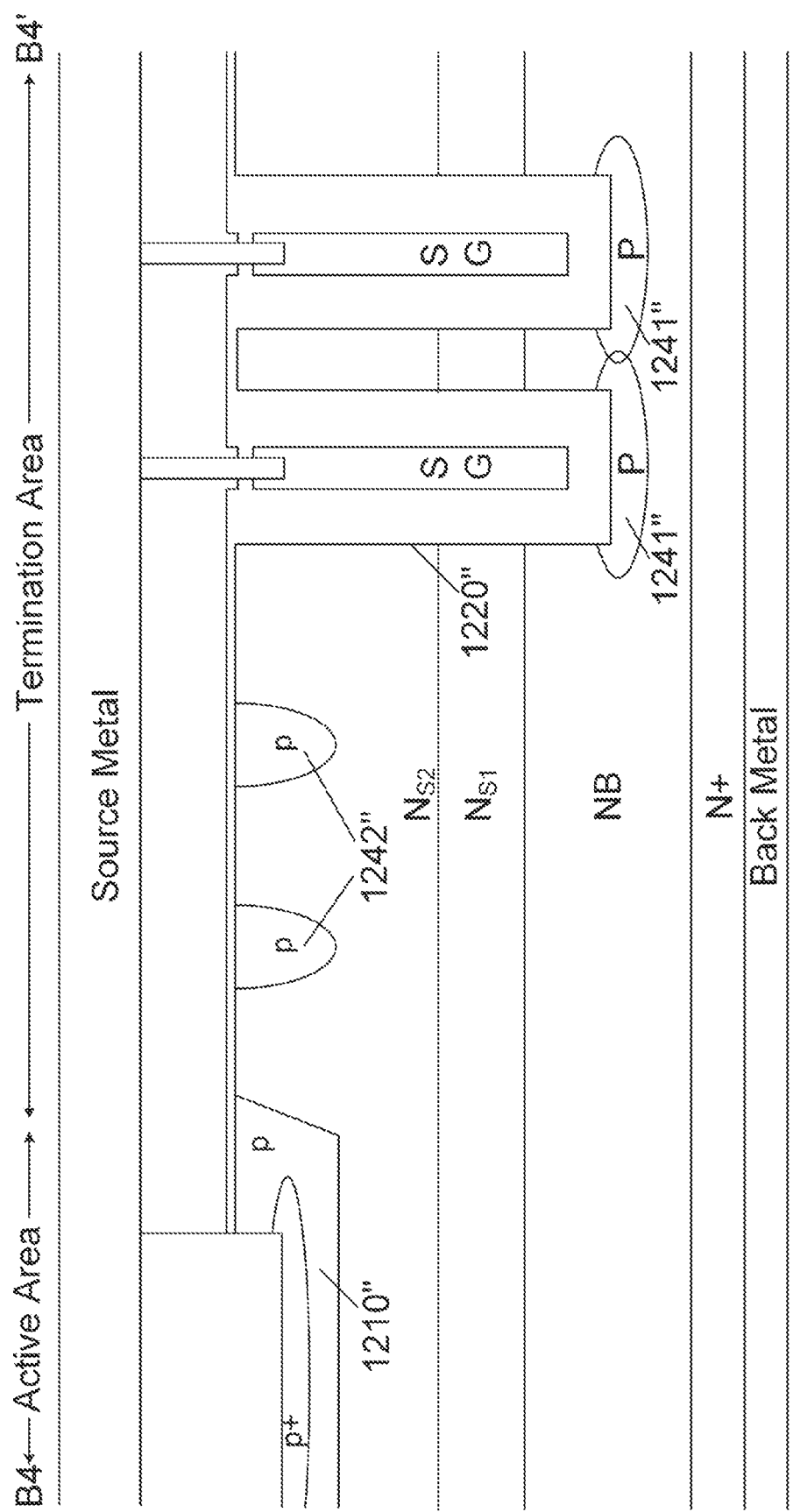
FIG. 12C is a cross-sectional view of another preferred embodiment along B4-B4' line of FIG. 5A according to the present invention.

Please refer to FIG. 12C for a cross-sectional view showing another preferred B4-B4' cross section of FIG. 5A according to the present invention. The semiconductor power device has a similar structure to FIG. 12B, except that, in FIG. 12C, two second type P body regions 1242" with floating voltages are formed between the first type P body regions 1210" and the termination trench 1220" for breakdown voltage enhancement.

Although the present invention has been described in terms of the presently preferred embodiments, it is to be understood that such disclosure is not to be interpreted as limiting. The embodiments described above often show N-channel devices, the embodiments can also be applied to P-channels devices by reversing the polarities of the conductivity types. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:
1. A shielded gate trench (SGT) device comprising:
an active area, a termination area, a gate metal pad area and at least one gate metal runner;
said active area comprising a plurality of gate trenches along a first axis, formed in an epitaxial layer of a first conductivity type onto a substrate of said first conductivity type, surrounded by a first type source regions of a first conductivity type encompassed in a first type body regions of a second conductivity type near a top surface of said epitaxial layer of said first conductivity type, each of said plurality of gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an (Inter-Poly Oxide) IPO film, said gate oxide surrounds said gate electrode and has less thickness than said first insulating film;

said termination area comprising at least one termination trench surrounding the outer periphery of said plurality of gate trenches in a first direction along said first axis and in a second direction along a second axis wherein said first axis is vertical to said second axis, said at least one termination trench is separated from said plurality of gate trenches, and a termination trench field plate disposed in said at least one termination trench and insulated from said epitaxial layer by a second insulating film, said termination trench field plate is shorted together with said first type source and said first type body regions through a source metal; and a first type electric field reducing regions formed adjacent to intersection regions between said at least one termination trench along said second axis and trench ends of said plurality of gate trenches along said first axis; and said first type electric field reducing region formed between said first type body regions and said at least one termination region along said second axis wherein said first type body regions are absent.

2. The SGT device of claim 1, wherein said first type electric field reducing regions also located adjacent to said gate metal pad area.

3. The SGT device of claim 1, further comprising a channel stop region in said termination area with a second type source region the same as said first type source regions in said active area, and shorted together with said epitaxial layer underneath a channel stop metal.

4. The SGT device of claim 1, wherein said epitaxial layer is a single epitaxial layer with an uniform doping concentration.

5. The SGT device of claim 1, wherein said epitaxial layer has multiple stepped epitaxial layers with doping concentrations decreasing stepwise in a direction from bottoms of said plurality of gate trenches toward said first type body regions along sidewalls of said plurality of gate trenches.

6. The SGT device of claim 5, further comprising a second type electric field reducing region of said first conductivity type surrounding each bottom of said plurality of gate trenches in said active area and a bottom of said at least one termination trench in said termination area with a doping concentration lower than a bottom first epitaxial layer of said multiple epitaxial layers on said substrate.

7. The SGT device of claim 5, further comprising a second type electric field reducing region of said first conductivity type surrounding each bottom of said gate trenches in said active area with a doping concentration lower than a bottom first epitaxial layer of said multiple epitaxial layers on said substrate, and a third type electric field reducing region of said second conductivity type surrounding a bottom of said at least one first type termination trench in said termination area.

8. The SGT device of claim 1, wherein said gate electrode is disposed above said shielded gate electrode inside each of said plurality of gate trenches.

9. The SGT device of claim 1, wherein said shielded gate electrode is disposed in the middle and said gate electrode is disposed surrounding upper portion of said shielded gate electrode.

10. A shielded gate trench (SGT) device comprising:

an active area comprising a plurality of gate trenches along a first axis, formed in an epitaxial layer of a first conductivity type onto a substrate of said first conductivity type, surrounded by a first type source regions of a first conductivity type are encompassed in a first type body regions of a second conductivity type near a top surface of said epitaxial layer of said first conductivity type, each of said plurality of gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an (Inter-Poly Oxide) IPO film, said gate oxide surrounds said gate electrode and has less thickness than said first insulating film;

a termination area comprising at least one termination trench surrounding the outer periphery of said plurality of gate trenches in a first direction along said first axis and in a second direction along a second axis wherein said first axis is vertical to said second axis, said at least one first type termination trench is separated from said plurality of gate trenches, and a termination trench field plate disposed in said at least one termination trench and insulated from said epitaxial layer by a second insulating film, said termination trench field plate is shorted together with said first type source and said first type body regions through a source metal;

a first type electric field reducing regions without having said first type body regions formed between said first type body regions in said active area and said at least one termination trench along said second axis has at least one second type body region of said second conductivity type with a floating voltage; wherein said at least one second type body region is spaced apart from said first type body regions and spaced apart from said at least one termination trench.

11. The SGT device of claim 10, wherein said at least one second type body region has one second type body region.

12. The SGT device of claim 10, wherein said at least one second type body region has multiple second type body regions spaced apart from each other.

13. The SGT device of claim 10, wherein said epitaxial layer is a single epitaxial layer with a uniform doping concentration.

14. The SGT device of claim 10, wherein said epitaxial layer has MSE layers with doping concentrations decreasing stepwise in a direction from bottoms of said plurality of gate trenches toward said first type body regions along sidewalls of said gate trenches.

15. The SGT device of claim 14, further comprising a second type electric field reducing region of said first conductivity type surrounding each bottom of said plurality of gate trenches in said active area and of said at least one termination trench in said termination area with a doping concentration lower than a bottom first epitaxial layer of said multiple epitaxial layers on said substrate.

16. The SGT device of claim 14, further comprising a second type electric field reducing region of said first conductivity type surrounding each bottom of said gate trenches in said active area with a doping concentration lower than a bottom first epitaxial layer of said multiple epitaxial layers on said substrate, and a third type electric field reducing region of said second conductivity type surrounding a bottom of said at least one termination trench in said termination area.

17. The SGT device of claim 10, wherein said gate electrode is disposed above said shielded gate electrode inside each of said plurality of gate trenches.

18. The SGT device of claim 10, wherein said shielded gate electrode is disposed in the middle and said gate electrode is disposed surrounding upper portion of said shielded gate electrode.

19. A shielded gate trench (SGT) device comprising:
an active area comprising a plurality of gate trenches along a first axis, formed in an epitaxial layer of a first conductivity type onto a substrate of said first conductivity type, surrounded by a first type source regions of a first conductivity type are encompassed in a first type body regions of a second conductivity type near a top surface of said epitaxial layer of said first conductivity type, each of said plurality of gate trenches is filled with a gate electrode and a shielded gate electrode; said shielded gate electrode is insulated from said epitaxial layer by a first insulating film, said gate electrode is insulated from said epitaxial layer by a gate oxide, said shielded gate electrode and said gate electrode are insulated from each other by an (Inter-Poly Oxide) IPO film, said gate oxide surrounds said gate electrode and has less thickness than said first insulating film;
a termination area comprising at least one termination trench surrounding the outer periphery of said plurality of gate trenches in a first direction along said first axis and in a second direction along a second axis wherein said first axis is vertical to said second axis, said at least one first type termination trench is separated from said plurality of gate trenches, and a termination trench field plate disposed in said at least one termination trench and insulated from said epitaxial layer by a second insulating film, said termination trench field plate is shorted together with said first type source and said first type body regions through a source metal;
a first type electric field reducing region between said first type body regions in said active area and said at least one termination trench along said second axis has at least one second type body region of said second conductivity type with a floating voltage; and said at least one second type body region is spaced apart from said first type body regions and said at least one termination trench as well;
an Oxide Charge Balance (OCB) region formed between two adjacent of said gate trenches below said body regions and above a bottom of said shielded gate electrode;
a buffer region formed between said substrate and said OCB region;
said epitaxial layer in said OCB region has multiple stepped epitaxial (MSE) layers with different doping concentrations decreasing stepwise in a direction from a bottom of said shielded gate electrode to said first type body regions along sidewalls of said plurality of gate trenches, wherein each of said MSE layers has a uniform doping concentration as grown;
said epitaxial layer in said buffer region has a doping concentration lower than each of said MSE layers in said OCB region;
a second type electric field reducing region of said first conductivity type surrounding each bottom of said gate trenches in said active area with a doping concentration lower than a bottom first epitaxial layer of said MSE layers on said substrate; and
a third type electric field reducing region of said second conductivity type surrounding a bottom of said at least one first type termination trench in said termination area.

* * * * *